（12）United States Patent
Ho et al.

(10) Patent No.: US 7,763,518 B2
(45) Date of Patent: Jul. 27, 2010

(54) ULTRA-THIN SOI VERTICAL BIPOLAR TRANSISTORS WITH AN INVERSION COLLECTOR ON THIN-BURIED OXIDE (BOX) FOR LOW SUBSTRATE-BIAS OPERATION AND METHODS THEREOF

(75) Inventors: Herbert L. Ho, New Windsor, NY (US); Mahender Kumar, Fishkill, NY (US); Qiqing Ouyang, Yorktown Heights, NY (US); Paul A. Papworth, Wappingers Falls, NY (US); Christopher D. Sheraw, Wappingers Falls, NY (US); Michael D. Steigerwalt, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/099,437

(22) Filed: Apr. 8, 2008

(65) Prior Publication Data
US 2008/0230869 A1 Sep. 25, 2008

Related U.S. Application Data

(62) Division of application No. 10/787,002, filed on Feb. 25, 2004, now Pat. No. 7,375,410.

(51) Int. Cl.
*H01L 21/331* (2006.01)
(52) U.S. Cl. ............... 438/311; 438/322; 257/E21.372; 257/526
(58) Field of Classification Search ................. 438/309, 438/311, 322; 257/526, E21.372
See application file for complete search history.

(56) References Cited

U.S. PATENT DOCUMENTS

| 4,965,872 | A | 10/1990 | Vasudev |
| 5,352,624 | A | 10/1994 | Miwa et al. |
| 5,621,239 | A | 4/1997 | Horie et al. |
| 5,627,401 | A | 5/1997 | Yallup |
| 2004/0119136 | A1 | 6/2004 | Cai et al. |

(Continued)

FOREIGN PATENT DOCUMENTS

JP 2000327 1/1990

(Continued)

*Primary Examiner*—Ha Tran T Nguyen
*Assistant Examiner*—Daniel Whalen
(74) *Attorney, Agent, or Firm*—Scully, Scott, Murphy & Presser, P.C.; Vazken Alexanian

(57) ABSTRACT

The present invention provides a "collector-less" silicon-on-insulator (SOI) bipolar junction transistor (BJT) that has no impurity-doped collector. Instead, the inventive vertical SOI BJT uses a back gate-induced, minority carrier inversion layer as the intrinsic collector when it operates. In accordance with the present invention, the SOI substrate is biased such that an inversion layer is formed at the bottom of the base region serving as the collector. The advantage of such a device is its CMOS-like process. Therefore, the integration scheme can be simplified and the manufacturing cost can be significantly reduced. The present invention also provides a method of fabricating BJTs on selected areas of a very thin BOX using a conventional SOI starting wafer with a thick BOX. The reduced BOX thickness underneath the bipolar devices allows for a significantly reduced substrate bias compatible with the CMOS to be applied while maintaining the advantages of a thick BOX underneath the CMOS.

17 Claims, 25 Drawing Sheets

U.S. PATENT DOCUMENTS

2005/0184360 A1   8/2005   Ho et al.
2008/0132025 A1*  6/2008   Ho et al. .................... 438/311

FOREIGN PATENT DOCUMENTS

| JP | 05243255 A | 9/1993 |
| JP | 5243573 | 9/1993 |
| JP | 7038005 | 2/1995 |
| JP | 07326630 | 12/1995 |
| JP | 7335663 | 12/1995 |
| JP | 9051101 | 2/1997 |
| JP | 11312684 | 11/1999 |
| JP | 2000242470 | 9/2000 |
| JP | 2000340795 | 12/2000 |
| JP | 2001110816 | 4/2001 |
| JP | 2001203357 | 7/2001 |
| JP | 2002158290 | 5/2002 |
| JP | 2002-258422 | 9/2002 |
| WO | WO2004/015755 | 2/2004 |

* cited by examiner

ULTRA-THIN SOI VERTICAL BIPOLAR TRANSISTORS WITH AN INVERSION COLLECTOR ON THIN-BURIED OXIDE (BOX) FOR LOW SUBSTRATE-BIAS OPERATION AND METHODS THEREOF

RELATED APPLICATIONS

This application is a divisional of U.S. patent application Ser. No. 10/787,002, filed Feb. 25, 2004.

FIELD OF THE INVENTION

The present invention relates to semiconductor devices, and more particularly to a vertical bipolar transistor that does not include an impurity-doped collector. Instead, the bipolar transistor of the present invention contains a minority carrier inversion layer as the collector. The present invention also provides a method for forming such a vertical bipolar transistor.

BACKGROUND OF THE INVENTION

The semiconductor industry has been seeking more cost effective solutions for manufacturing integrated bipolar transistors and complementary metal oxide semiconductor (CMOS) devices (hereinafter Bi/CMOS) for mass applications of radio frequency (RF)/analog and wireless/fiber-based telecommunications for decades. Si/SiGe BiCMOS technology is widely used and has been quite successful. However, as CMOS adopts the thin silicon-on-insulator (SOI) substrate for lower power and higher speed (due to device scaling), the thick sub-collector of conventional bipolar junction transistors (BJTs) becomes incompatible with the integration of high-performance SOI CMOS devices.

In order to facilitate integration with SOI CMOS, lateral SOI BJTs have been proposed and studied. See, for example, S. Parke, et al. "A versatile, SOI CMOS technology with complementary lateral BJT's", IEDM, 1992, Technical Digest, 13-16 Dec. 1992, page(s) 453-456; V. M. C. Chen, "A low thermal budget, fully self-aligned lateral BJT on thin film SOI substrate for lower power BiCMOS applications", VLSI Technology, 1995. Digest of Technical Papers. 1995 Symposium on VLSI Technology, 6-8 Jun. 1995, page(s) 133-134; T. Shino, et al. "A 31 GHz fmax lateral BJT on SOI using self-aligned external base formation technology", Electron Devices Meeting, 1998. IEDM '98 Technical Digest, International, 6-9 Dec. 1998, page(s) 953-956; T. Yamada, et al. "A novel high-performance lateral BJT on SOI with metal-backed single-silicon external base for low-power/low-cost RF applications", Bipolar/BiCMOS Circuits and Technology Meeting, 1999. Proceedings of the 1999, 1999, page(s)129-132; and T. Shino, et al. "Analysis on High-Frequency Characteristics of SOI Lateral BJTs with Self-Aligned External Base for 2-GHz RF Applications", IEEE, TED, vol. 49, No. 3, pp. 414, 2002.

Even though lateral SOI BJT devices are easier to integrate with SOI CMOS, the performance of such devices is quite limited. This is because the base width in the lateral SOI BJTs is determined by lithography. Hence it cannot be scaled down (less than 30 nm) readily without more advanced and more expensive lithography technologies such as e-beam lithography.

Another type of SOI BJT, which is a vertical SOI SiGe bipolar device with a fully depleted collector, has also been proposed, and demonstrated to offer higher base-collector breakdown voltage, higher early voltage and better breakdown voltage of the collector and emitter with an opened base $(BV_{CEO})$-cutoff frequency $f_T$ tradeoff. See, for example, U.S. Patent Application Publication 2002/0089038 A1 to T. Ning, and co-assigned U.S. application Ser. No. 10/328,694, filed Dec. 24, 2002. However, the integration process of these vertical SOI BJTs and SOI CMOS is still quite complex and expensive.

In view of the above, there is a need for providing a new and improved vertical SOI bipolar transistor that overcomes the drawbacks associated with prior art SOI BJTs.

SUMMARY OF THE INVENTION

The present invention overcomes the problems of prior art vertical SOI BJTs by providing a "collector-less" SOI BJT which has no impurity-doped collector. Instead, the inventive vertical SOI BJT uses a back gate-induced, minority carrier inversion layer as the intrinsic collector when it operates. In accordance with the present invention, the SOI substrate is biased such that an inversion layer is formed at the bottom of the base region serving as the collector. The advantage of such a device is its CMOS-like process. Therefore, the integration scheme can be simplified and the manufacturing cost can be significantly reduced. However, for a typical SOI substrate with a buried oxide (BOX) thickness of 100 nm, a substrate bias of 30 V is required in order to generate the inversion layer. Such a high bias is not desirable. In order for such a bipolar device to be practical for BiCMOS on SOI applications, the substrate bias should be equal to or less than the bias applied to the CMOS, typically 3 V or less.

The present invention also provides a method of fabricating BJTs on areas of a very thin BOX using a conventional SOI starting wafer with a thick BOX. The reduced BOX thickness underneath the bipolar devices allows for a significantly reduced substrate bias compatible with the CMOS to be applied while maintaining the advantages of a thick BOX underneath the CMOS.

The bipolar transistor of the present invention, which has no impurity-doped collector, but rather uses a back gate-induced, minority carrier inversion layer as the collector is built on an SOI substrate in which the SOI thickness is preferred to be thin (less than 50 nm) for high performance. This is because the SOI thickness now dictates the base width in normal operation. The inventive device has no intrinsic collector when the substrate is not positively biased. When a positive bias is applied to the substrate, the holes in the p-type base will begin to deplete at the $Si/SiO_2$ interface, for an NPN transistor. If the substrate bias is higher than the threshold voltage, a thin inversion layer (electrons, approximately 5 nm) is formed and serves as the intrinsic collector. The inventive device becomes a vertical BJT after this thin inversion layer forms. For a PNP transistor, a negative bias is applied to the substrate and holes form in the thin inversion layer.

In broad terms, the inventive bipolar transistor comprises a conductive back electrode for receiving a bias voltage; an insulating layer located over the conductive back electrode; a first semiconductor layer located over the insulating layer, the first semiconductor layer including a base containing a first conductive type dopant and an extrinsic collector containing a second conductivity type dopant, the extrinsic collector borders the base; and an emitter comprising a second semiconductor layer containing the second conductivity type dopant located over a portion of the base, wherein the conductive back electrode is biased to form an inversion charge layer in the base at an interface between the first semiconductor layer and the insulating layer.

The device structure of the present invention can provide complementary BJTs and can be integrated directly with the current SOI CMOS technology. Hence, a complementary Bi/CMOS can be realized and provide new opportunities for circuit innovations. In one embodiment, a field effect transistor is formed in areas adjacent to the bipolar transistor of the present invention, said transistors being separated by trench isolation regions.

Simulation studies have shown that very good performance can be achieved with the inventive device structure. Simulation results show that with optimization of the device design, the Si-base (not SiGe-base) bipolar device can achieve $f_T$=55 GHz and $f_{max}$=132 GHz or $f_T$=70 GHz, $f_{max}$=106 GHz. On the other hand, the lateral SOI BJTs of the prior art have been demonstrated with $f_T$=16 GHz and $f_{max}$=25 GHz, $f_T$=7 GHz and $f_{max}$=60 GHz. See, for example, T. Shino and T. Yamada ibid, respectfully. In the foregoing, $f_T$ denotes the frequency when the current gain becomes unity and $f_{max}$ denotes the maximum oscillation frequency at which the unilateral power gain becomes unity.

Since typical SOI wafers normally have a relatively thick buried oxide (BOX) of greater than 100 nm, the substrate bias has to be greater than 30 V in order to form the inversion layer collector. Such a high bias is not desirable. In the present invention, a method of forming a localized thin BOX for the bipolar transistor with regular SOI wafers is provided. In broad terms, the method of the present invention includes the steps of: providing a silicon-on-insulator substrate comprising a first semiconductor layer located over a first insulating layer, wherein a portion of the first insulating layer beneath the first semiconductor layer is removed providing an undercut region; forming a second insulating layer on exposed surfaces of the first semiconductor layer, wherein the second insulating layer is thinner than the first insulating layer; filling the undercut region and the removed portion of the first semiconductor layer with a conductive material as the back electrode; forming an extrinsic base containing a first conductivity dopant and an extrinsic collector containing a second conductivity type dopant in portions of the first semiconductor layer; forming an emitter comprising a second semiconductor layer containing the second conductivity type dopant over a portion of said first semiconductor layer; and biasing the conductive back electrode to form an inversion charge layer at an interface between the first semiconductor layer and the second insulating layer.

Specifically, a trench is first etched through the SOI layer of an SOI substrate exposing the BOX which is normally 100-500 nm thick. A portion of the thick BOX is then removed using an isotropic etch process that undercuts the SOI layer. The isotropic etch is performed in the present invention after removing any pad layers from atop the SOI layer. If the pad layers remain on the SOI layer during this etching process, the SOI layer tends to bend upwards or downwards depending on the initial stress in the pad layers. Hence, pad layers are removed from the SOI layer prior to this etching step so that there are no films imparting stress on top of the SOI layer during the etching of the thick BOX. A thin oxide layer (less than 15 nm) is then grown or deposited to form the thin BOX. The trench and area where the thick BOX was removed is filled in with doped polysilicon. The doped polysilicon can be formed in-situ or after deposition of polysilicon by ion implantation. The polysilicon-fill can then be used to apply a substrate bias. With such a reduced BOX thickness underneath the bipolar devices, a significantly reduced substrate bias (less than 3 V) compatible with the CMOS is able to create a strong enough vertical electric field to form an inversion layer (inducing electrons) to form the intrinsic collector, while maintaining the advantages of a thick BOX underneath the CMOS.

There are no known alternative solutions to this problem. One possible alternative is to use a patterning process to form regions of thin and thick BOX on the SOI wafer during a separation by ion implantation of oxygen (SIMOX) process. However, by using an oxygen implant, it is difficult to make a thin BOX of less than 15 nm and have good control of the BOX thickness. Also, this method would require costly additional lithography and implant steps to produce the SOI wafers.

DETAILED DESCRIPTION OF THE INVENTION

Figure 1A:
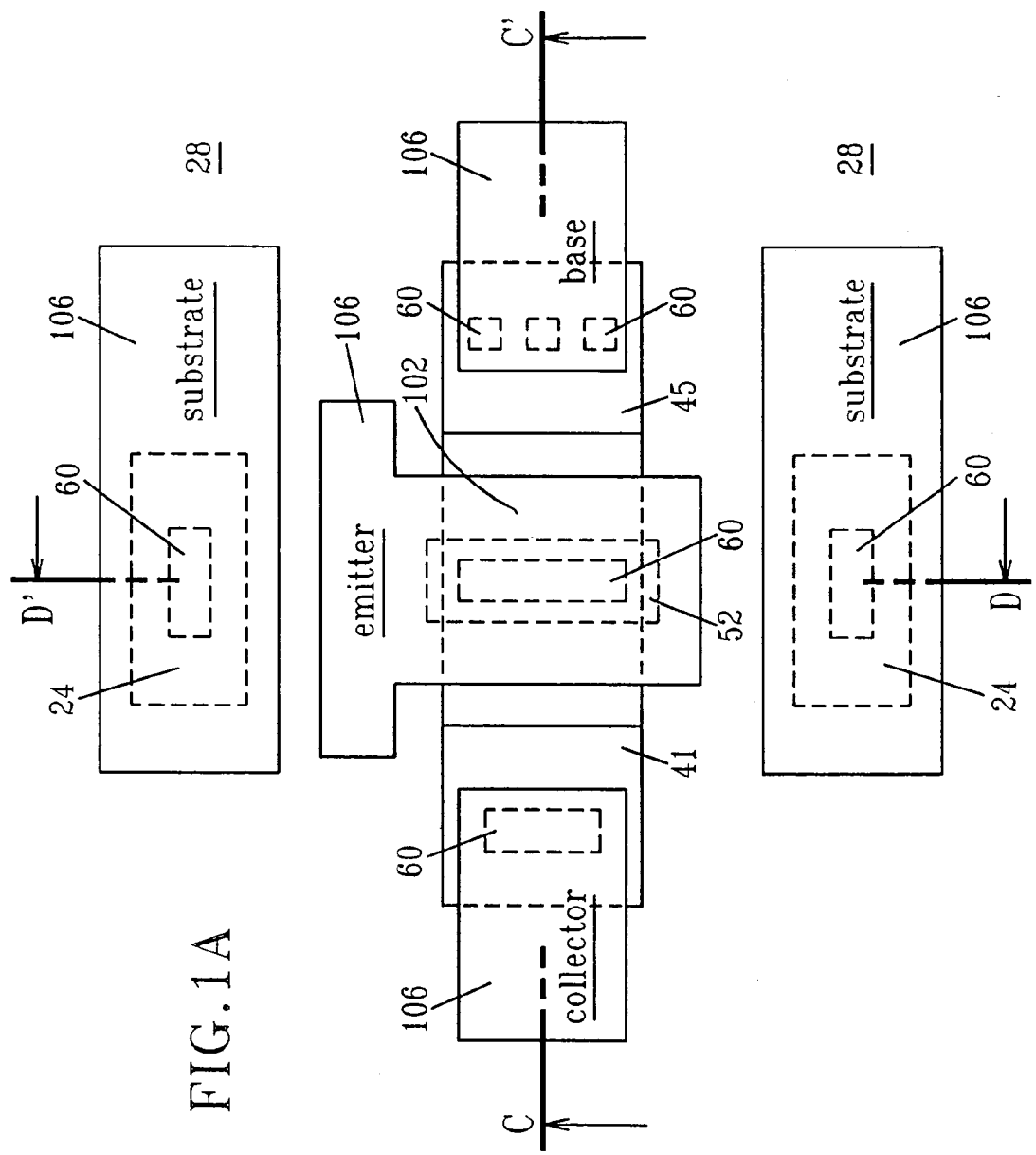
FIG. 1A shows the top down view for a single-finger emitter device of the present invention.

The present invention, which provides an ultra-thin SOI vertical bipolar transistor with an inversion collector on a thin BOX for low substrate bias operation and a method of fabricating the same, will now be described in more detail by referring to the drawings that accompany the present application.

As stated above, the present invention provides a bipolar transistor structure that includes a conductive back electrode for receiving a bias voltage, an insulating layer located over the conductive back electrode, and a first semiconductor layer located over the insulating layer. The first semiconductor layer includes a base containing a first conductivity type dopant and an extrinsic collector containing a second conductivity type dopant. In accordance with the present invention, the extrinsic collector borders the base. The inventive bipolar transistor also includes an emitter comprising a second semiconductor layer of the second conductivity type dopant located over a portion of the base. During operation, the conductive back electrode is biased to form an inversion charge layer in the base at an interface between the first semiconductor layer and the insulating layer. The configuration of the inventive bipolar transistor structure will become more apparent by referring to FIGS. 1A-1D.

Figure 1B:
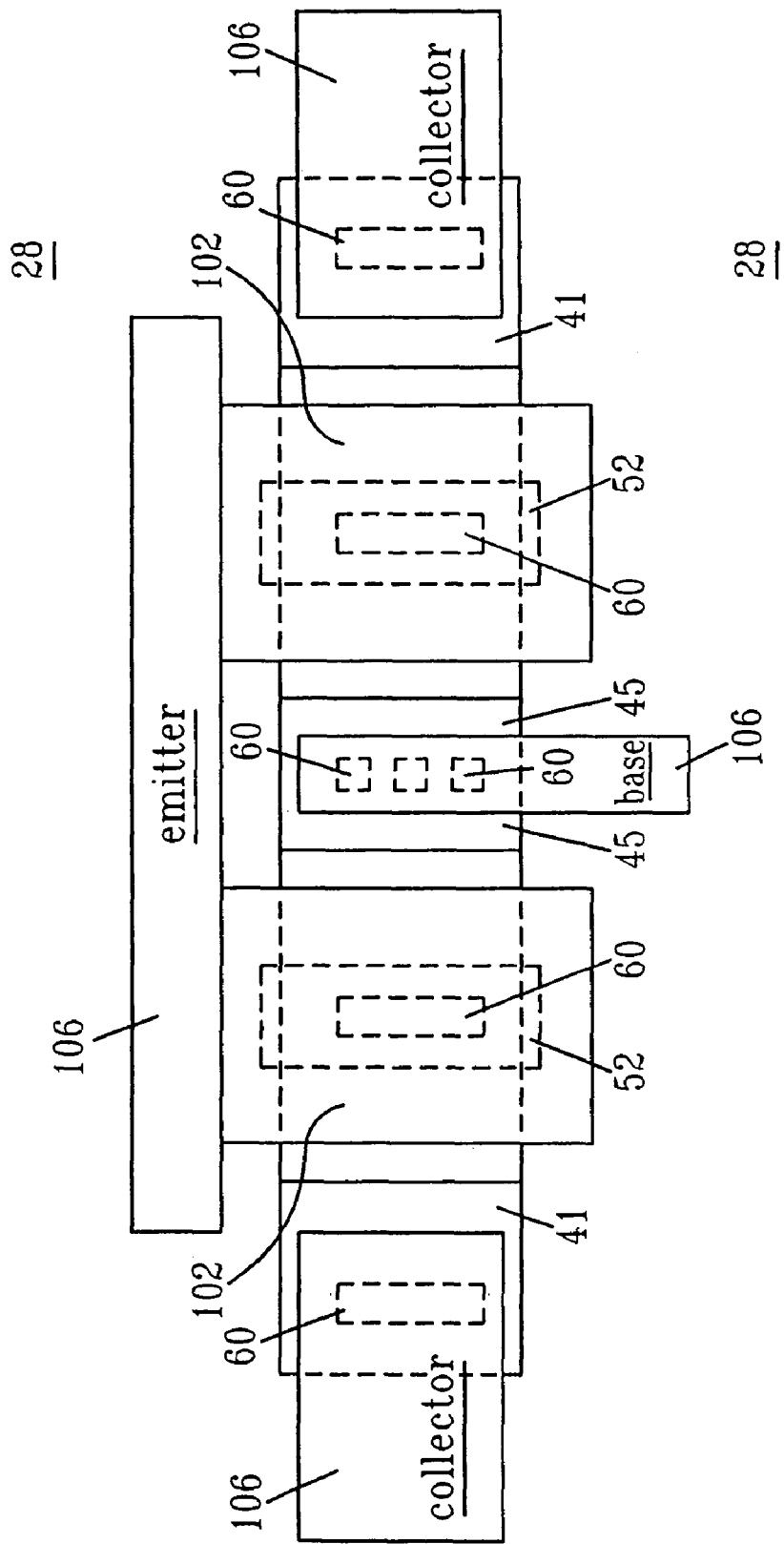
FIG. 1B shows the top down view for a two-finger emitter device of the present invention. A multi-finger configuration reduces the emitter resistance for achieving high $f_{max}$.

Two device layouts of the inventive bipolar transistor are shown in FIGS. 1A and 1B. The device layouts shown in FIGS. 1A-1B represent two different embodiments of the present invention. In the embodiment shown in FIG. 1A, a single-finger emitter device is shown, while in FIG. 1B a two-finger emitter device is shown. By "finger", it is meant that the emitter has at least one portion that extends outward from a common emitter region. Although FIGS. 1A and 1B show one-finger and two-finger emitter devices, respectively, the present invention is not limited to only those types of devices. Instead, the present invention contemplates thin-BOX device layouts that include a number of emitter-fingers. Multi-finger configurations are preferred over the singe-finger device layout since they typically reduce the emitter resistance for achieving high $f_{max}$.

In the two device layouts shown in FIGS. 1A-1B, reference numeral 106 denotes metal pads formed atop the device after back-end-of-the-line (BEOL) processing, reference numeral 24 denotes the conductive back electrode, reference numeral 28 denotes isolation regions, reference numeral 52 denotes poly emitter, reference numeral 102 denotes the active area, reference numeral 60 denotes metal contacts formed in an interlevel dielectric having contact openings, reference numeral 41 denotes the extrinsic collector, typically an n+ implant region, and reference numeral 45 denotes the extrinsic base, typically a p+ implant region. The opposite conductivities for the extrinsic base and the extrinsic collector are also contemplated herein. The terms substrate, emitter, collector, and base, are included within FIGS. 1A-1B to provide proper orientation to the viewer.

In the one-fingered embodiment of the present invention, the emitter-finger 104 is located on axis D-D' between the extrinsic base 45 and the extrinsic collector 41, which lie along the axis C-C'. The device layout shown in FIG. 1A represents the simplest layout that requires the smallest area for fabrication.

In the two-fingered embodiment, the extrinsic base 45 is located between the two-emitter fingers 52 and the extrinsic collectors 41 are located at either side of the structure. Thus, in the two-finger emitter layout the two outer extrinsic collectors 41 have a single common inner extrinsic base 45. As indicated above, the two-figured device layout reduces emitter resistance thereby increasing $f_{max}$. This device layout requires more space to fabricate than the single-fingered device layout shown in FIG. 1A and a larger collector area (as compared to the single-fingered emitter device) also reduces the collector resistance.

Figure 1C:
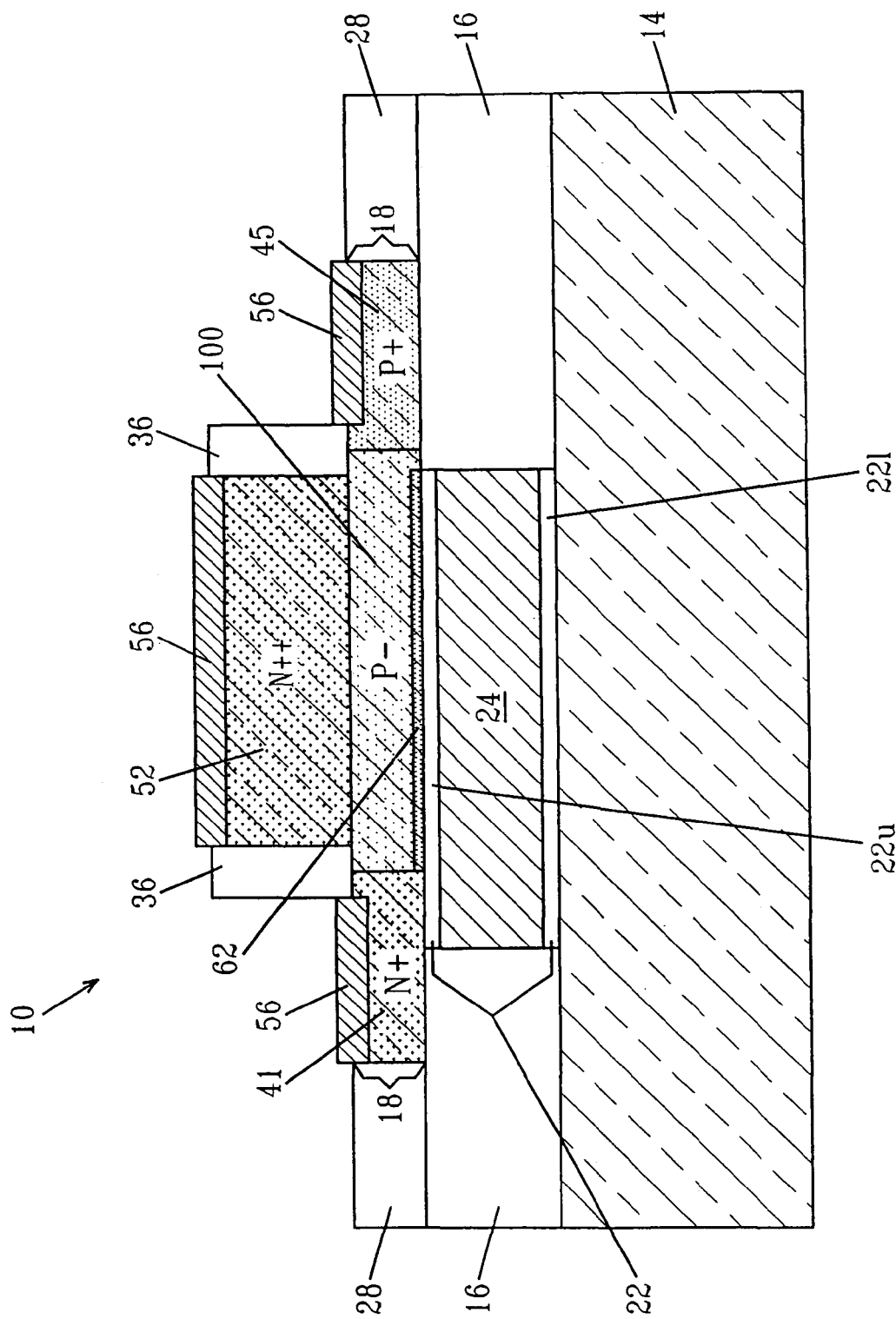
FIGS. 1C and 1D show the cross-sectional schematics of the single-finger emitter device of FIG. 1A along two directions, D-D', and C-C'.
Figure 1D:
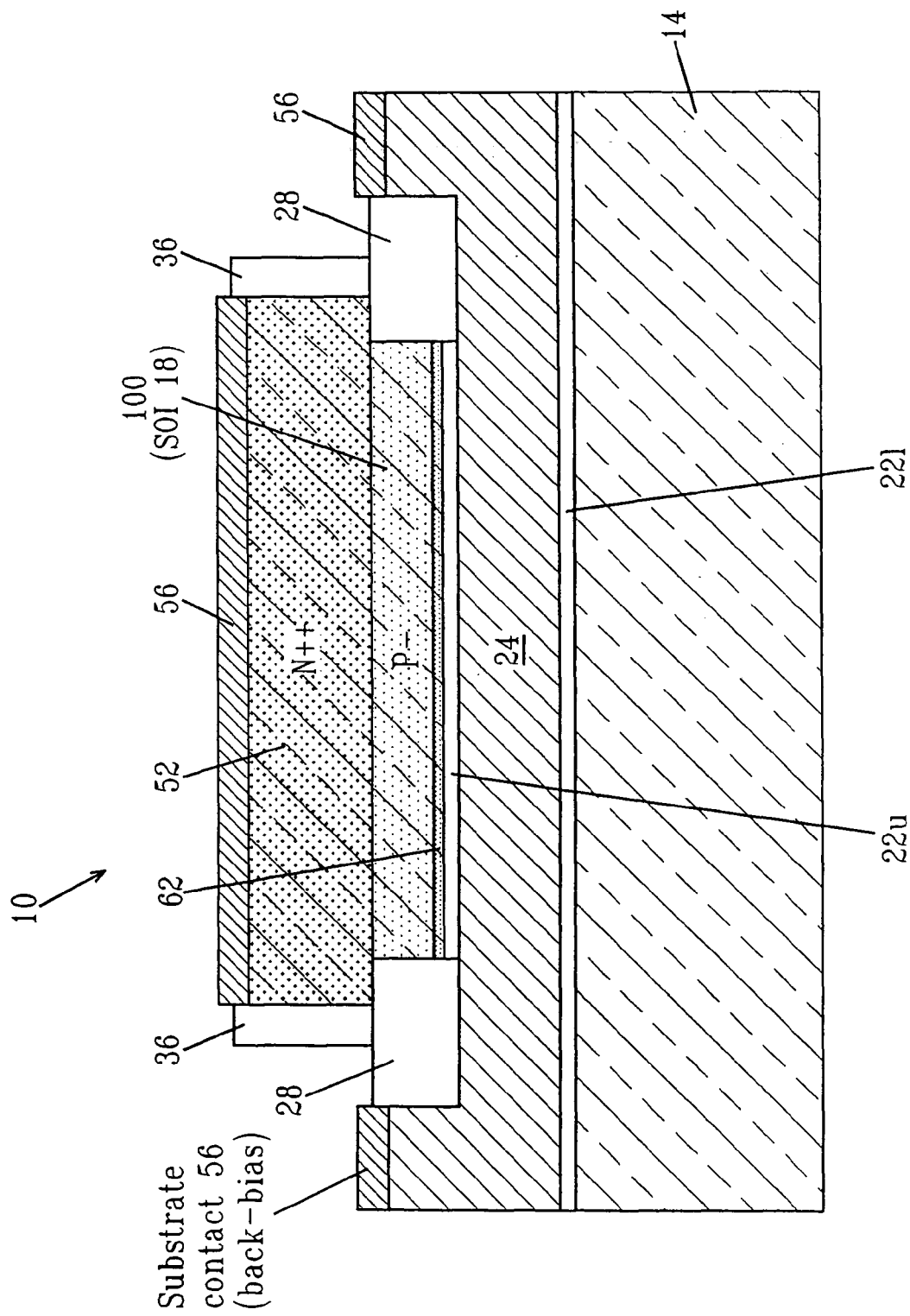

The cross sectional views of the single-finger emitter device layout is shown in FIGS. 1C and 1D. FIG. 1C is the cross sectional view along the axis C-C', while FIG. ID is the cross sectional view along the axis D-D'. Specifically, the cross sectional views shown in FIG. 1C and FIG. 1D depict a vertical bipolar transistor 10 of the present invention. The vertical bipolar transistor 10 includes a Si-containing substrate layer 14, a first insulating layer 16 (hereinafter referred to the thick buried oxide, BOX) having a first thickness, a second insulating layer (hereinafter referred to as the thin BOX) having a second thickness that is less than the first thickness of the thick BOX 16. As shown, the thick BOX 16 is located on an upper surface of the Si-containing substrate 14, and a lower portion of the thin BOX 22l is also located on the upper surface of the Si-containing substrate 14, while an upper portion of the thin BOX 22u is located on an upper surface of conductive back electrode 24. The upper thin BOX 22u is the insulating layer in which the inversion layer will form thereon. The thin BOX represented by 22l and 22u can also be referred to herein by just reference numeral 22.

The vertical bipolar transistor shown in FIGS. 1C-1D further includes trench isolation regions 28 that are located, as shown in FIG. 1C, atop the thick BOX 16, as well as atop the conductive back electrode 24, as shown in FIG. 1D. Hence, the trench isolation regions 28 surround the active device region of the structure. The structure also includes a first semiconductor layer 18 (hereinafter referred to as the SOI layer) which is located on the upper portion of the thin BOX 22u as well as a portion of the thick BOX 16. The first semiconductor layer 18 is the original SOI layer of the initial substrate employed in the present invention.

In accordance with the present invention, the first semiconductor layer 18 comprises a base 100 of the bipolar transistor that is doped with a first conductivity type dopant, either an n- or p-type dopant and an extrinsic collector 41 that is doped with a second conductivity type dopant, either an n- or p-type dopant, which is different from the first conductivity type dopant. The first semiconductor layer 18 also includes an extrinsic base 45 that is doped with the first conductivity type dopant. The extrinsic base 45 has a greater dopant density, i.e., concentration, as compared to the base 100. As shown, the extrinsic collector 41 borders the base 100 on one side of the bipolar transistor and the extrinsic base 45 borders the other side of the base 100. Atop of base 100 is an emitter 52 which is comprised of a second semiconductor layer. The second semiconductor layer forming emitter 52 may be comprised of the same or different material as the first semiconductor layer 18. The emitter 52 is heavily doped with the second conductivity type dopant. Spacers 36 are shown about the emitter 52.

The emitter 52, the extrinsic collector 41, and the extrinsic base 45 have a metal silicide 56 formed thereon. A metal silicide 56 is also formed, as shown in FIG. 1D, on any exposed surface of conductive back electrode 24. The metal silicide 56 located atop the exposed surfaces of the conductive back electrode 24 is the region in which biasing of the substrate can take place. During biasing, a portion of the base 100 that is located atop the upper thin BOX 22u is converted into an inversion charge layer 62. The inversion charge layer 62 is a minority carrier layer which serves as the collector of the inventive bipolar transistor. This is unlike prior art bipolar transistor in which the collector is comprised of an impurity-doped region.

Figure 2:
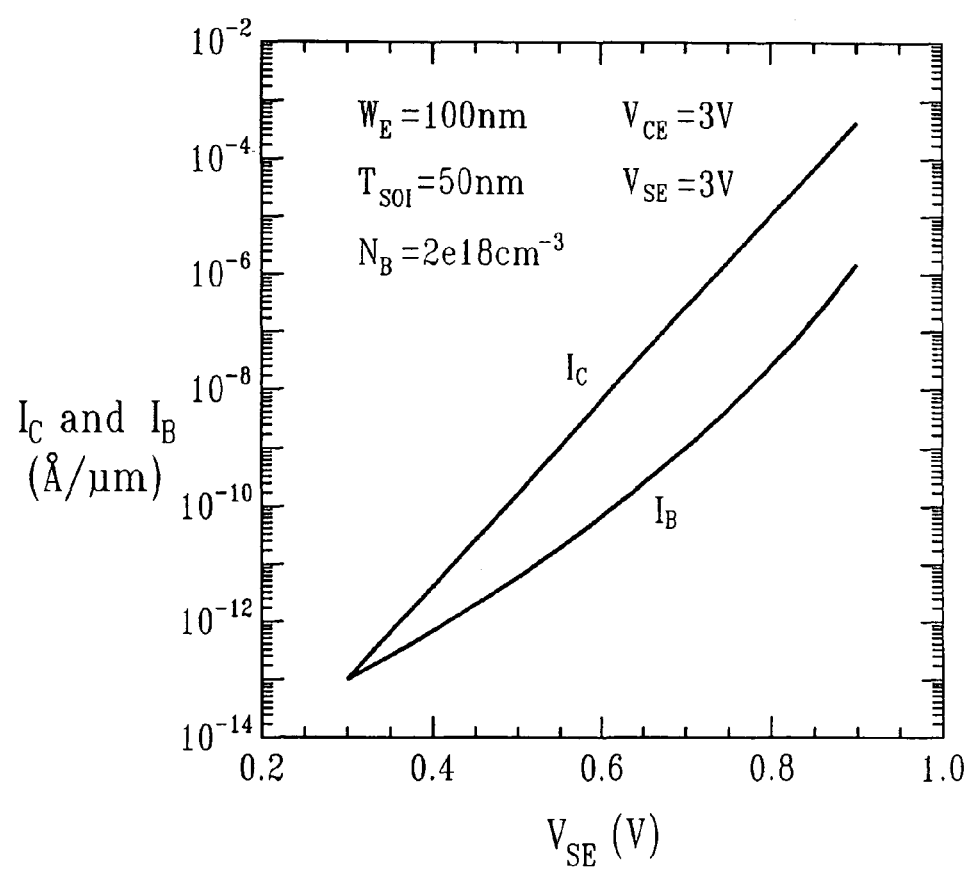
FIG. 2 is a simulated Gummel plot for a device with $W_E$=100 nm, $T_{SOI}$=50 nm, $N_B$=2e18 cm$^3$ and $T_{ox}$=10 nm at $V_{SE}$=3 V and $V_{CE}$=3 V.
Figure 3:
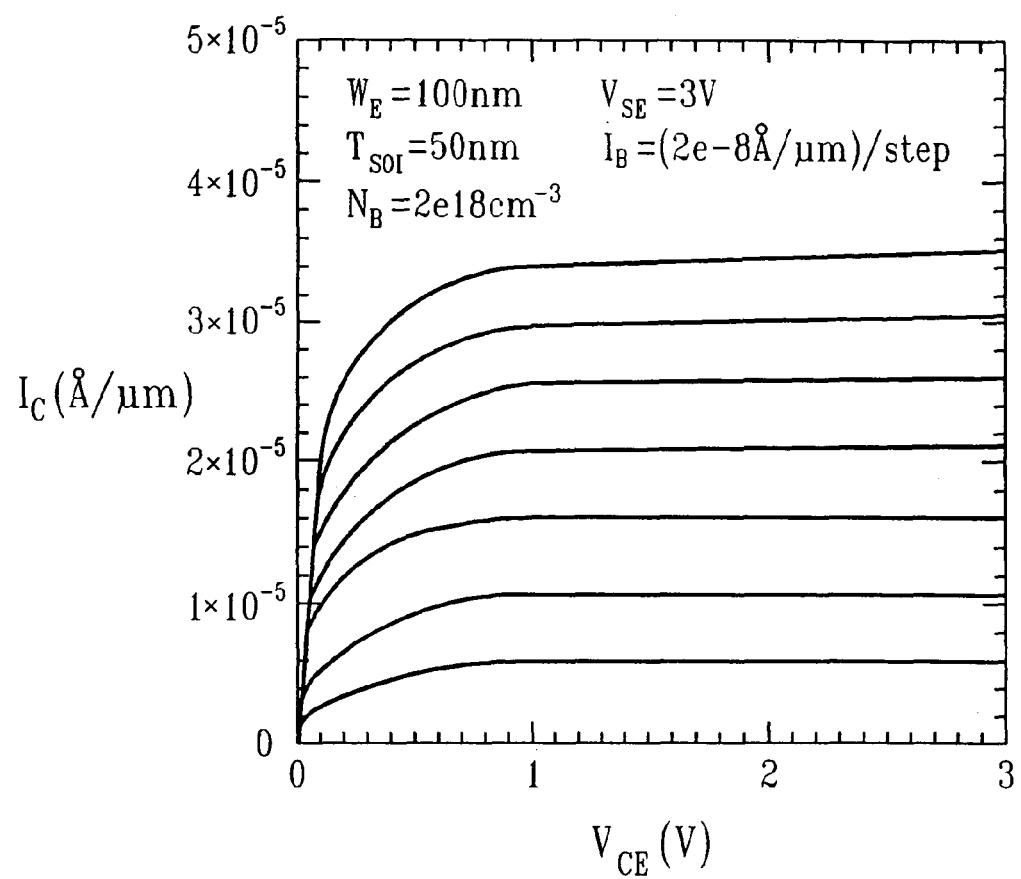
FIG. 3 is a simulated output characteristics for the device in FIG. 2 at $V_{SE}$=3 V.
Figure 4:
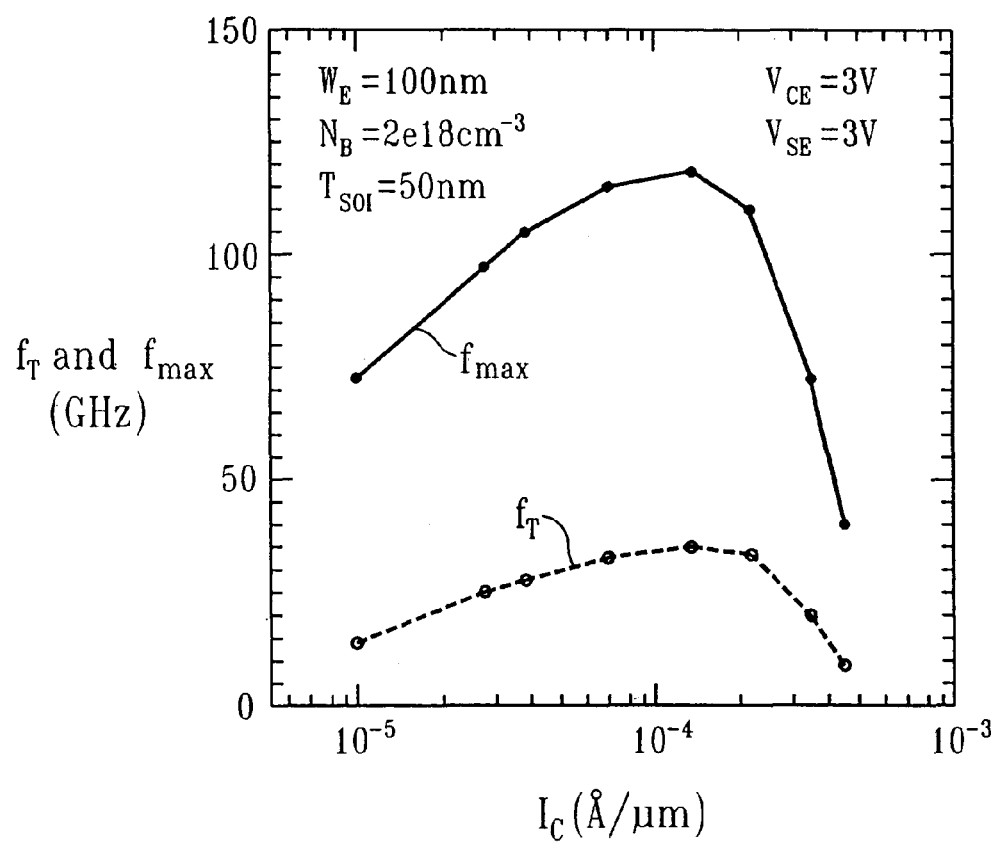
FIG. 4 is a simulated $f_T$ and $f_{max}$ vs. $I_C$ for the device in FIG. 2 at $V_{SE}$=3 V.
Figure 5:
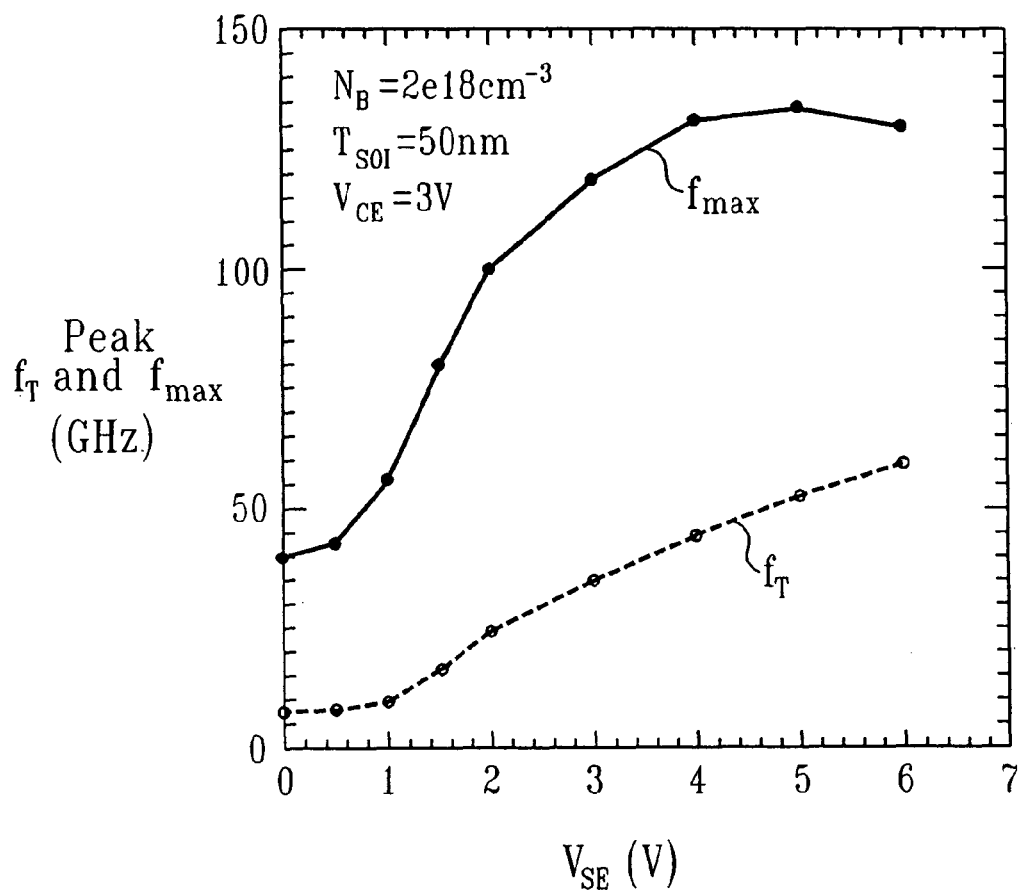
FIG. 5 is a simulated peak $f_T$ and $f_{max}$ vs. $V_{SE}$ for the device in FIG. 2 at $V_{CE}$=3 V.

A single-finger emitter device such as the one depicted in FIG. 1D has been simulated to check the device performance. The device has an emitter stripe width of 100 nm, a box-like base doping profile ($N_B$) of 2E18 cm$^{-3}$ and a SOI thickness of 50 nm. FIGS. 2 and 3 show the Gummel plot and the output characteristics respectively, at $V_{SE}$=3 V. The current gain (β) is above 230 over a wide range of the collector current. The Early voltage ($V_A$) is 102 V. The RF performance is extracted from small signal analyses, and is plotted at $V_{SE}$=3 V in FIG. 4. $f_T$ and $f_{max}$ reach their peak values of 35 GHz and 118 GHz at $I_C$=132 mA/mm, respectively. The impact of the substrate bias on the RF performance is shown in FIG. 5, where the peak $f_T$ and $f_{max}$ are plotted vs. $V_{SE}$.

Figure 6:
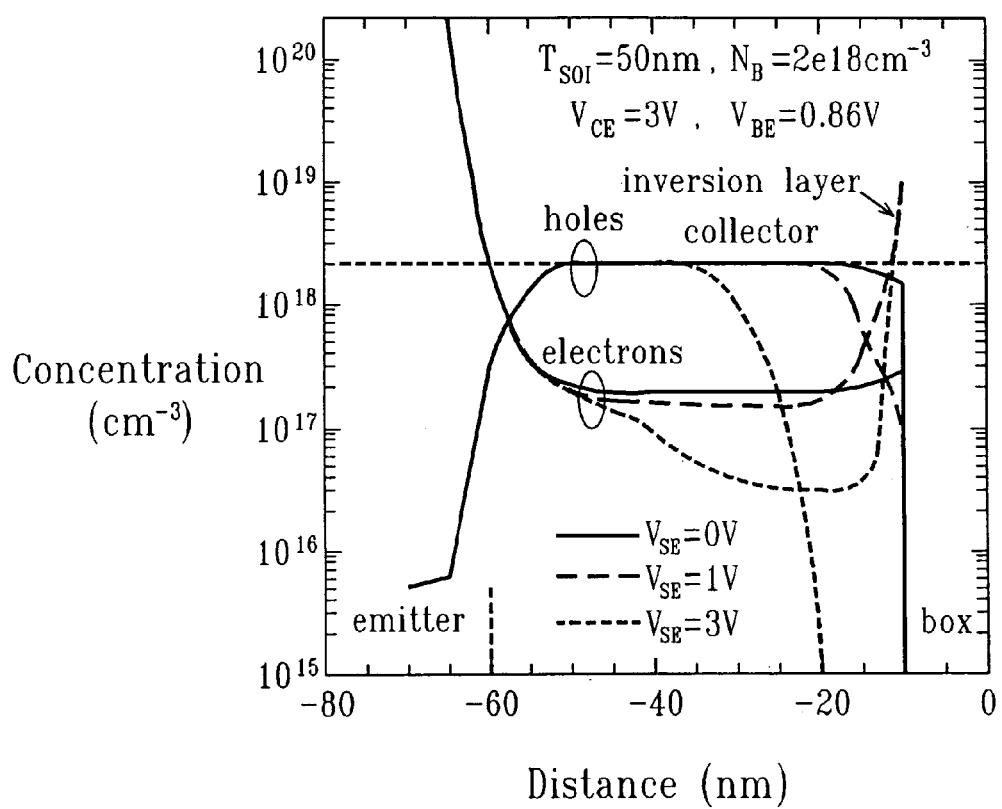
FIG. 6 is a one-dimensional cut of carrier concentration through the center of the emitter for the device in FIG. 2 at $V_{CE}$=3 V, $V_{BE}$=0.86 V, and $V_{SE}$=0, 1 and 3 V.
Figure 7:
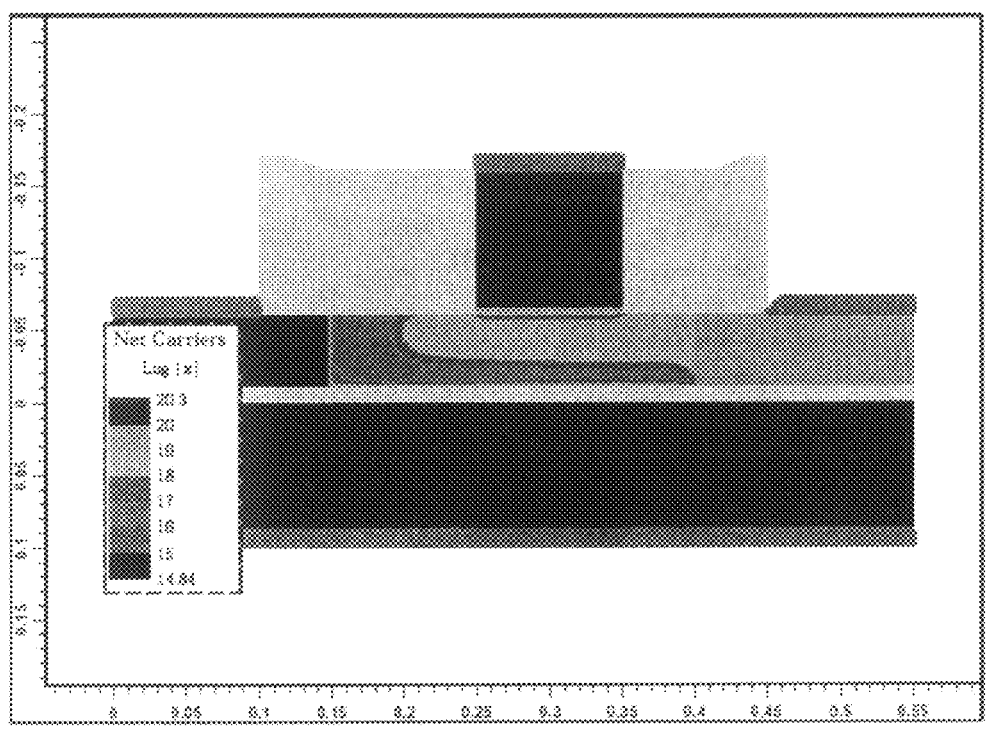
FIG. 7 is a two-dimensional contour of the net carrier concentration for the device in FIG. 2 at $V_{SE}$=3 V, $V_{CE}$=3 V and $V_{BE}$=0.86 V.

FIG. 6 shows a vertical cut of the carrier concentration through the center of the emitter at the biases of $V_{CE}=3$ V, $V_{BE}=0.86$ V and $V_{SE}=0$, 1, and 3 V. At $V_{SE}<1$ V, the inversion layer is unable to form at the back interface, and the device is a quasi-lateral BJT with the n++ region as the collector. However, at $V_{SE}>1$ V, the inversion layer forms, and the device becomes a vertical BJT with the inversion layer as the collector, as seen in FIG. 7, where a two-dimensional contour of the net carrier concentration at $V_{SE}=3$ V is illustrated. The substrate bias creates both the inversion layer and a depletion layer above it, and it also acts like the bias on the virtual collector. As $V_{SE}$ increases, the depletion layer gets wider and the inversion gets stronger, hence $W_B$ reduces and $r_b$ increases while $r_c$ and $C_{dBC}$ decrease. The net result is that $f_T$ and $f_{max}$ increase with increasing $V_{SE}$, as shown in FIG. 5. However, the increasing $r_b$ slows down the enhancement in $f_{max}$, particularly at large $V_{SE}$ values. Very high $V_{SE}$ should be avoided in practice in order to prevent oxide breakdown and base-collector punchthrough. Furthermore, it is noted that $V_{BE}$ also affects the depletion width and induced electron concentration. This is analgous to the body effect in a MOSFET, only that the body in our case is biased via a forward-biased p/n junction (E-B).

In the above two paragraphs, $W_B$ is the base width, $r_b$ is the base resistance, $r_c$ is the collector resistance, and $C_{dBC}$ is the base-collector capacitance. The "V's" denote a potential which is applied between the collector and emitter, $V_{CE}$, between the base and the emitter, $V_{BE}$, and between the substrate and emitter, $V_{SE}$.

Figure 8A:
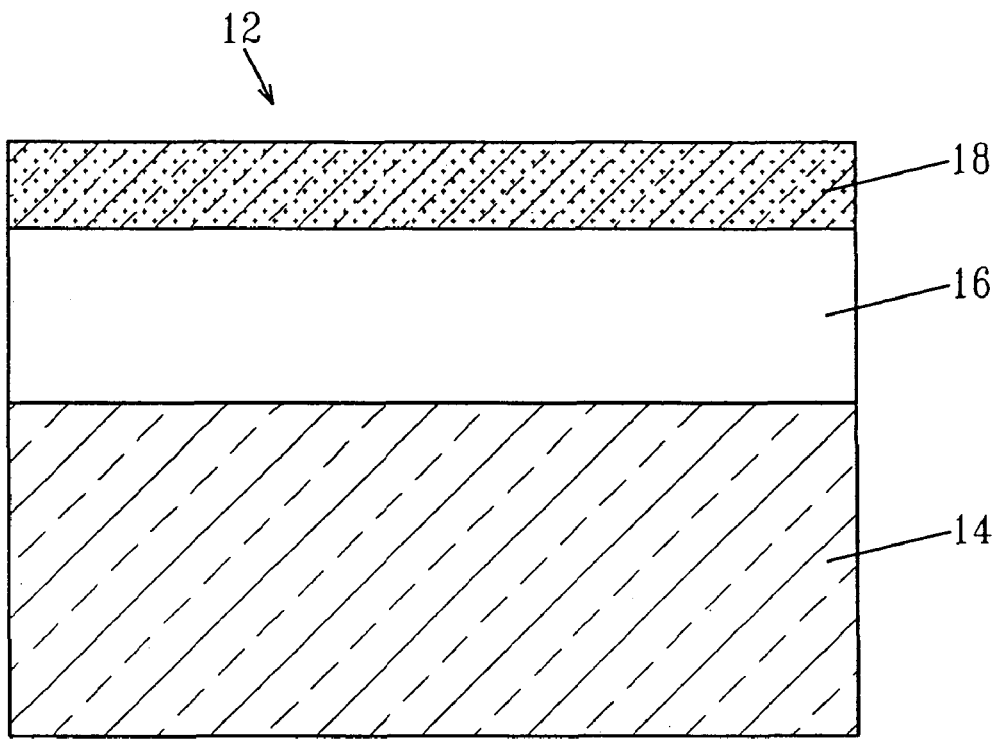
FIGS. 8A-8E illustrate the process flow employed in the present invention for creating the thin BOX region.

The process flow for making the thin BOX 22 is illustrated in FIGS. 8A-8E. Although BOX layers are depicted and described as oxides, the present invention works equally well when the thick BOX 16 and the thin BOX 22 are other insulating materials, i.e., nitride or oxynitrides. FIG. 8A shows the cross-section of a typical SOI substrate 12 used for a high-performance CMOS application that can be employed in the present invention. The initial SOI substrate 12 comprises a Si-containing substrate layer 14, a thick BOX 16, and a top Si-containing layer 18 (which is, in accordance with the nomenclature of the present invention, the first semiconductor layer or the SOI layer). The term "Si-containing" is used herein to denote any semiconductor material that includes silicon therein. Illustrative examples of such Si-containing materials include but are not limited to: Si, SiGe, SiGeC, SiC, Si/Si, Si/Sie, preformed SOI wafers, silicon germanium-on-insulators (SGOI) and other like semiconductor materials.

The SOI layer 18 of the initial SOI substrate 12 is typically a doped layer, which may contain an n- or p-type dopant. Doping can be introduced into the SOI layer 18 prior to, or after formation of the SOI substrate 12. A portion of the doped SOI layer 18 is the base 100 of the inventive bipolar transistor 10. The dopant concentration within the SOI layer 18 is typically from about 1E17 to about 1E19 atoms/cm³.

The Si-containing layer 18 of the SOI substrate 12 may have a variable thickness, which is dependent on the technique that is used in forming the SOI substrate 12. Typically, however, the Si-containing layer 18 of the SOI substrate 12 has a thickness from about 10 to about 1000 nm, with a thickness from about 50 to about 500 nm being more typical. The thickness of the thick BOX 16 may also vary depending upon the technique used in fabricating the SOI substrate 12. Typically, however, the thick BOX 16 of the present invention has a thickness from about 100 to about 1000 nm, with a BOX thickness from about 120 to about 200 nm being more typical. The thickness of the Si-containing substrate layer 14 of the SOI substrate 12 is inconsequential to the present invention.

The initial SOI substrate 12 can be formed using a layer transfer process such as, a bonding process. Alternatively, a technique referred to as separation by implanted oxygen (SIMOX) wherein ions, typically oxygen, are implanted into a bulk Si-containing substrate and then the substrate containing the implanted ions is annealed under conditions that are capable of forming a buried insulating layer, i.e., thick BOX 16, can be employed.

Figure 8B:
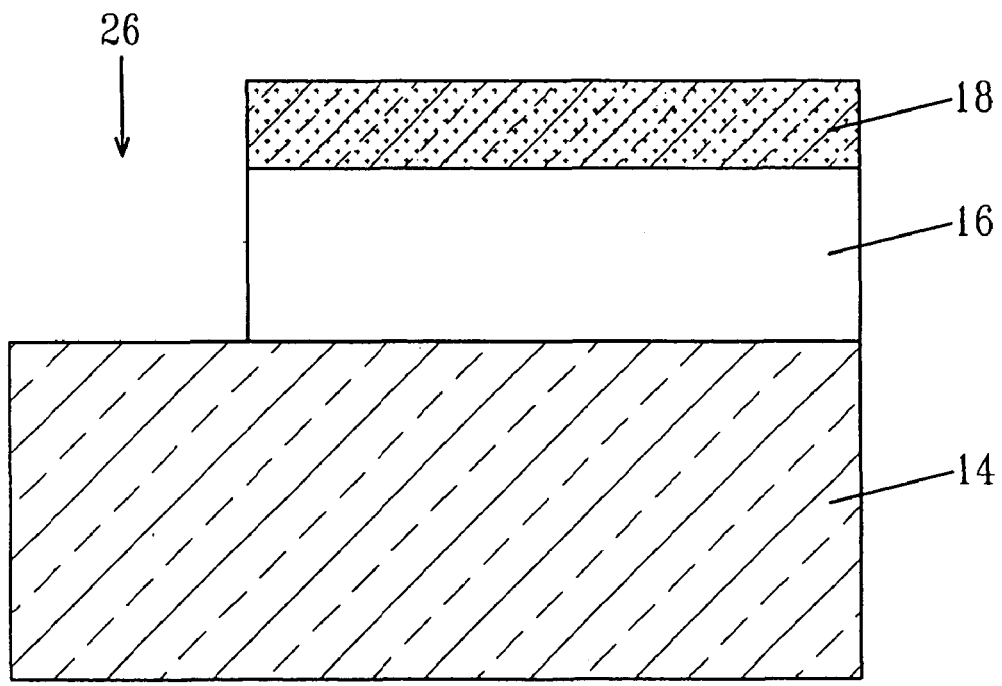

Next, and as shown in FIG. 8B, at least one trench 26 that extends to the upper surface of the Si-containing substrate layer 14 is formed by lithography and etching. The lithography step includes applying a photoresist to the surface of the SOI substrate 12, exposing the photoresist and developing the exposed photoresist using a conventional resist developer. The etching step used in forming the trench 26 includes any standard Si directional reactive ion etch process. Other dry etching processes such as plasma etching, ion beam etching and laser ablation, are also contemplated herein. The etch can be stopped on the top of the thick BOX 16 (not shown), or on the Si-containing substrate 14 underneath the thick BOX 16, as shown in FIG. 8B. As shown, portions of the SOI layer 18 and the thick BOX 16 that are protected by the patterned photoresist are not removed during etching. After etching, the patterned photoresist is removed utilizing a conventional resist stripping process.

Figure 8C:
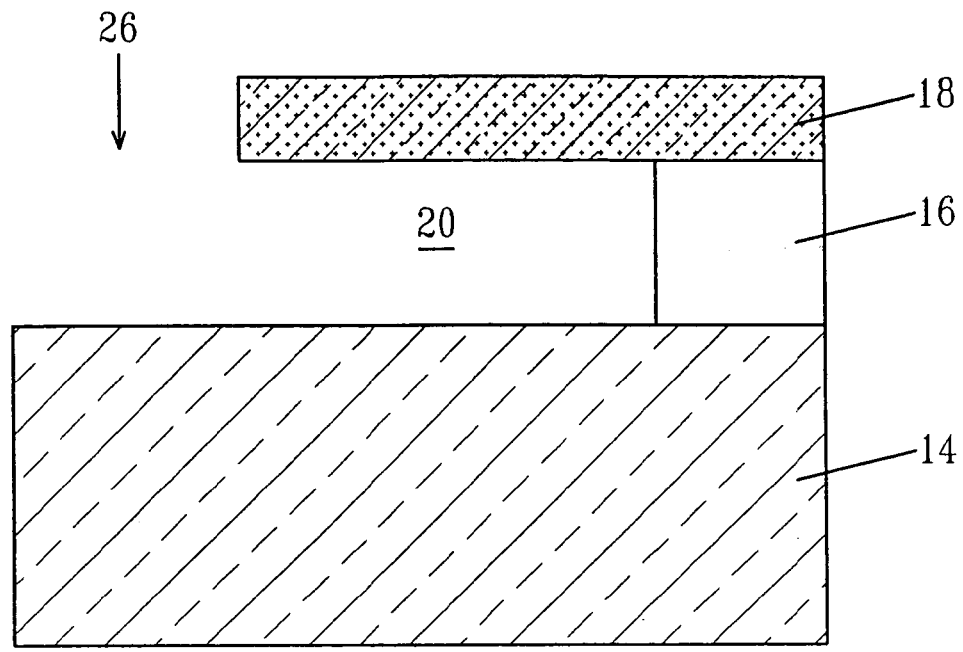

An isotropic oxide etch selective to silicon (such as a timed hydrofluoric acid based etch or similar etch chemistry) is then used to remove portions of the thick BOX 16 underneath the SOI layer 18 where the vertical bipolar device will be fabricated (See FIG. 8C). The isotropic etch forms an undercut 20 beneath the SOI layer 18 that will be subsequently filled with a conductive back electrode material. The SOI layer 18 is supported by portions of the thick BOX 16 that are not removed by this etch. Before this etching step, all pad layers should be removed from atop the SOI layer otherwise bending of the SOI layer occurs.

Figure 8D:
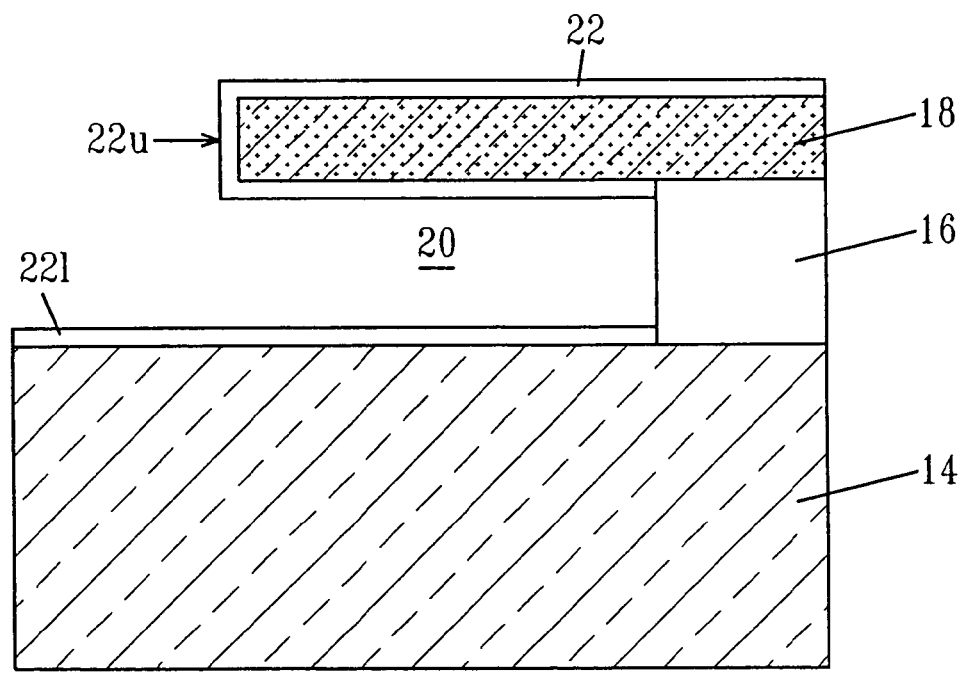

A thermal process such as a wet and/or dry oxidation, nitridation or oxynitridation, is then used to grow the second insulating layer 22, i.e., thin BOX, on the exposed surfaces of the SOI layer 18, see FIG. 8D. Note that the second insulating layer 22 forms on the exposed horizontal and vertical surfaces of the SOI layer 18 as well as the exposed surface of the Si-containing substrate layer 14. The thin BOX 22 formed on the SOI layer 18 is given the reference numeral 22u, while the BOX formed in the Si-containing substrate layer 124 is given the reference numeral 221. In accordance with the present invention, the thin BOX 22 has a second thickness that is less than the first thickness of the first insulating layer, i.e., thick BOX 16. Typically, the thin BOX 22 has a thickness from about 1 to about 15 nm. Deposited oxides such as a low-temperature oxide (LTO) or a high-density oxide (HTO) can also be employed. When deposited oxides are used, the oxide would also be present on the sidewalls of the opened structure as well. Note that the oxide also grows, although to a lesser extent, on oxide surfaces as well. The growth of oxide on an oxide surface is not, however, differentiated in the drawings of the present application.

At this point of the present invention, a conductive back gate electrode material such as, for example, doped polysilicon, a silicide or a conductive metal is deposited to fill in the area previously occupied by the removed thick BOX 16. The deposition is performed using a conventional deposition process such a chemical vapor deposition, plasma-assisted chemical vapor deposition, chemical solution deposition, evaporation and the like. In one embodiment, doped polysilicon is used as the conductive back electrode material and it is deposited at a temperature from about 400° to about 700° C.

using a low-pressure chemical vapor deposition (LPCVD) process. Doping of the polysilicon layer may occur in-situ or after deposition using an ion implantation process. The structure can then be planarized, if needed, by chemical mechanical polishing or by a dry etch of the polysilicon selective to oxide. The resultant structure that is formed after performing the above steps is shown, for example, in FIG. 8E.

Figure 8E:
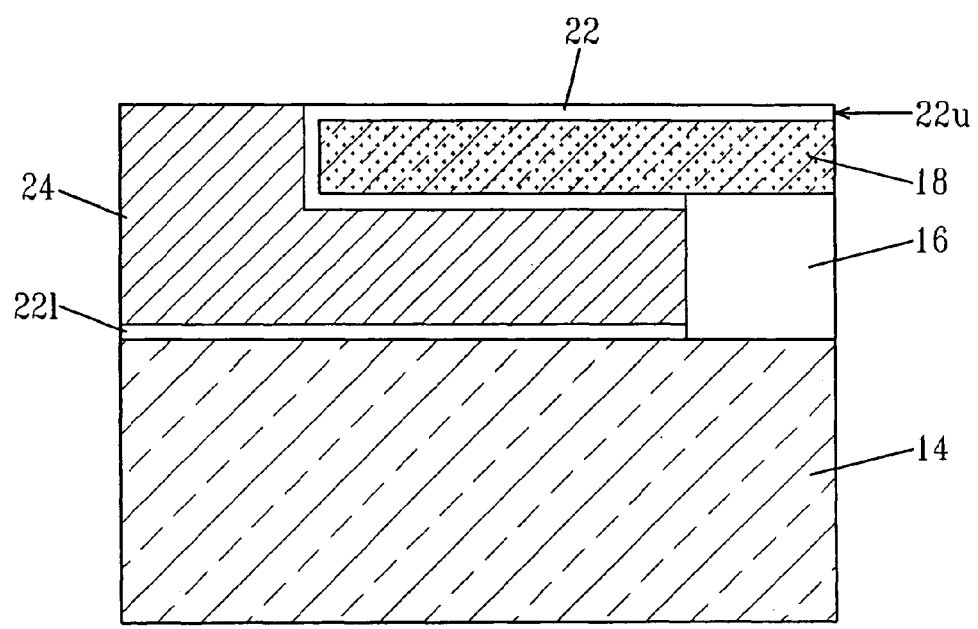
Figure 8F:
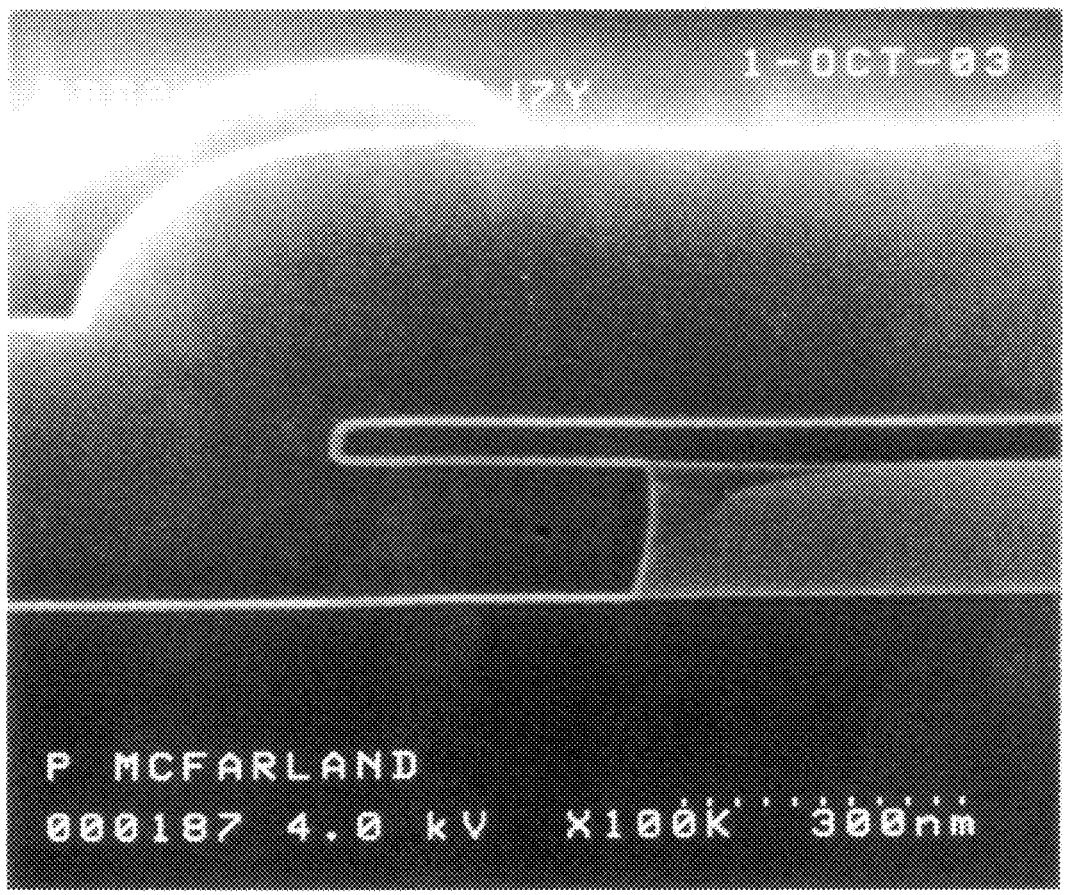
FIGS. 8F-8G show cross sectional SEMs of an SOI wafer that is subjected to the method of the present invention. The BOX was undercut by 0.3 microns. An 8 nm thick thermal oxide was then grown followed by LPCVD polysilicon fill.
Figure 8G:
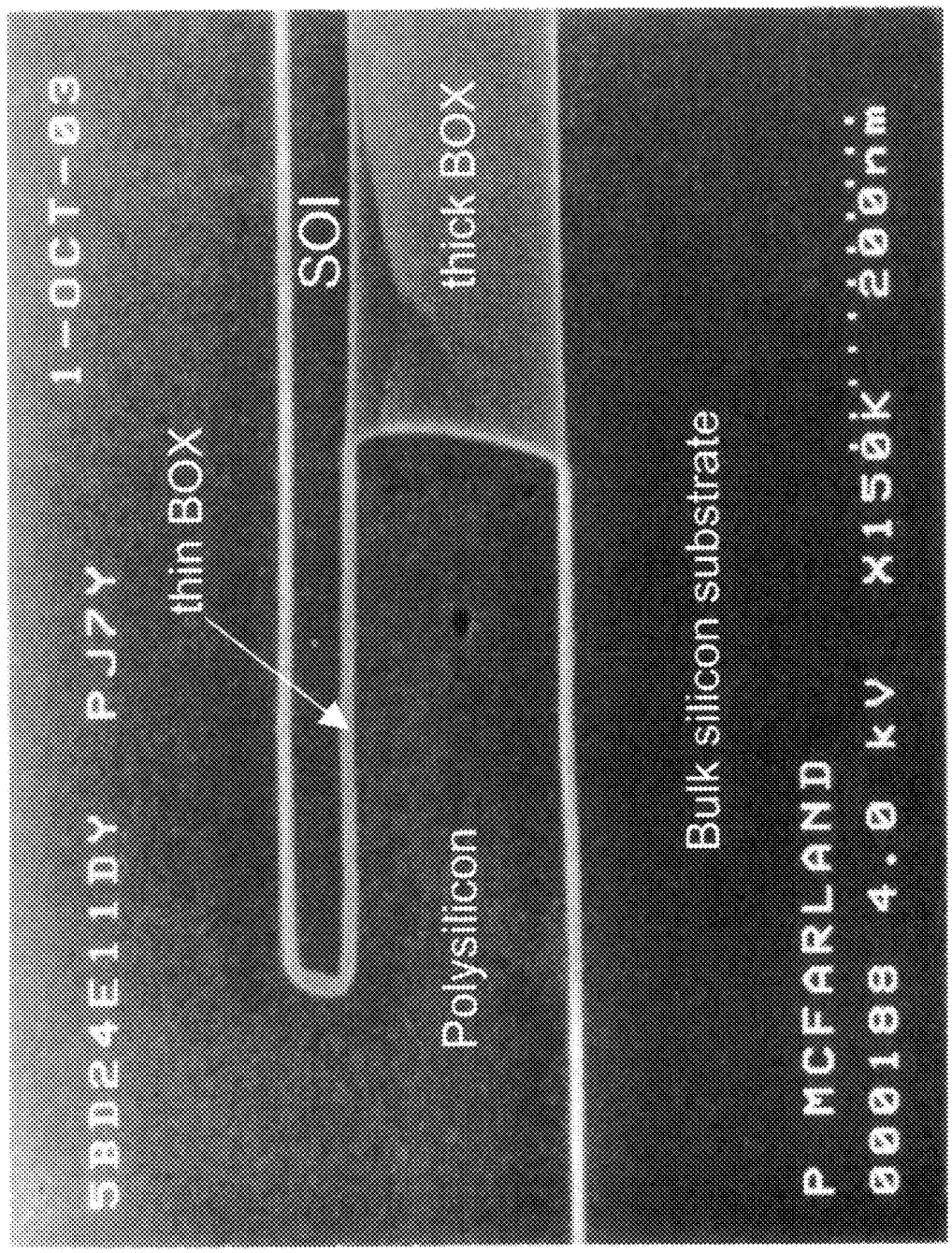

FIG. 8F and FIG. 8G show an SEM cross section of an SOI wafer that underwent the process described above. The BOX was undercut by 0.3 microns. An 8 nm thick thermal oxide was then grown followed by LPCVD polysilicon fill.

Figure 8H:
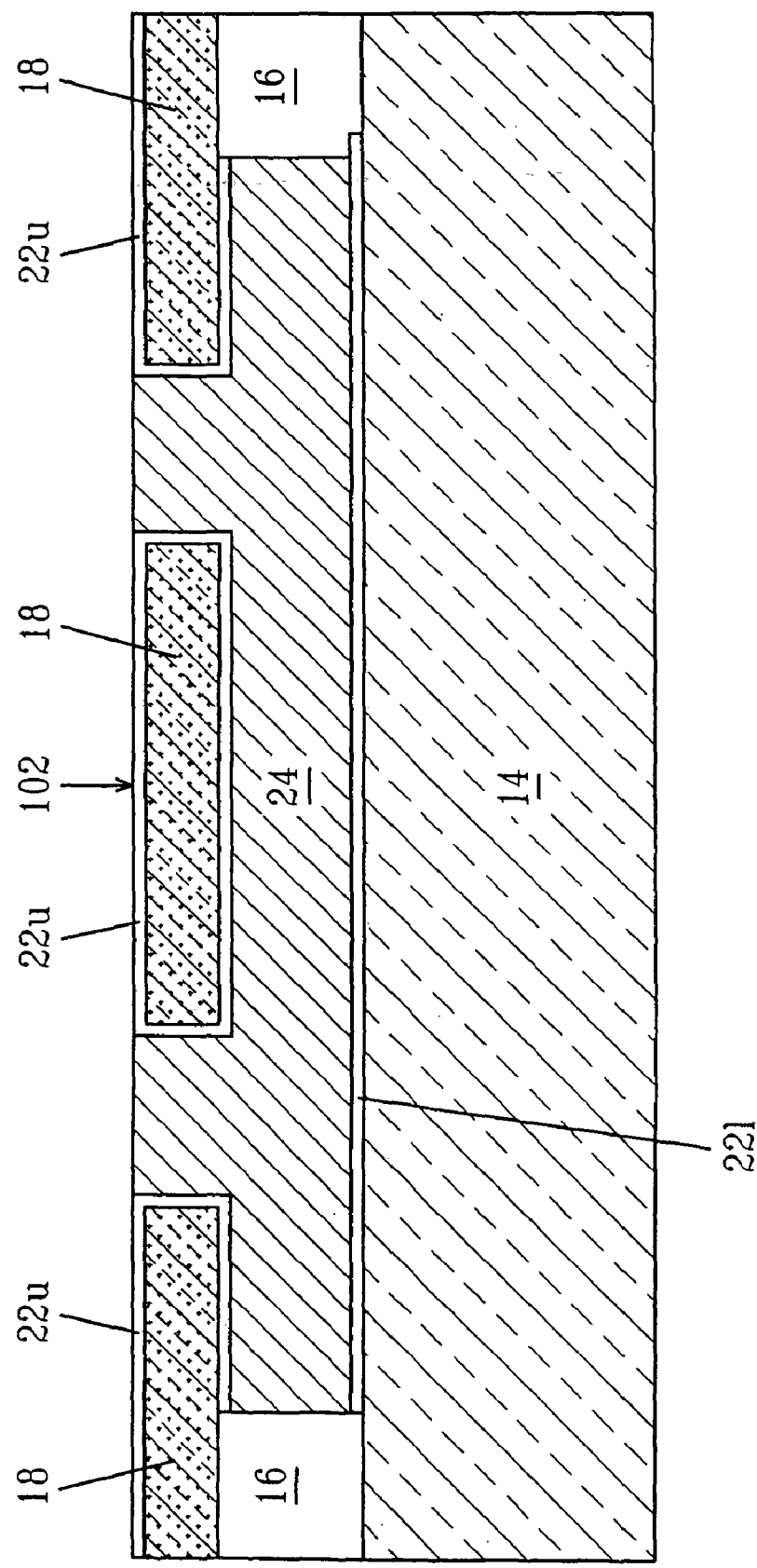
FIG. 8H is an expanded view of the structure shown in FIG. 8E.

FIG. 8H shows an expanded cross sectional view of the structure depicted in FIG. 8E. Region 102 denotes the active device area in which a bipolar transistor can be formed. The active area 102 includes an upper thin BOX 22u located atop the conductive back electrode 24. The conductive electrode 24, in turn, is located on the lower thin BOX 22l, which is located atop the Si-containing substrate layer 14.

FIGS. 9A-9H depict a simple process flow for fabricating the bipolar device after thin BOX formation. Although the method is depicted and described herein, the present invention contemplates other methods of forming a bipolar transistor atop the active areas 102 of the structure shown in FIG. 8H. In the embodiment described and illustrated, the extrinsic collector 41 and the extrinsic base 45 are self-aligned to the emitter 52 using the spacers 36 as in a conventional CMOS process. After fabricating the bipolar transistor shown in FIG. 9H, a metallic pad 106 can be formed atop the interlevel dielectric 58 having conductive filled openings 60.

The bipolar transistor is formed by first forming trench isolation regions 28 in the structure shown in FIG. 8E or 8H. The trench isolation regions 28 are formed by conventional processes well known in the art including, for example, trench definition and etching, optionally lining the trench with a liner material and then filling the trench with a trench dielectric material such as, for example, tetraethylorthosilicate (TEOS) or a high-density oxide. The trench dielectric material can be densified after the filling of the trench and, if needed, a planarization process, such as chemical mechanical polishing can be performed.

Next, a screen oxide 30 is formed on the surface of the structure by a thermal oxidation process or by a conventional deposition process such as chemical vapor deposition. The thickness of the screen oxide 30 can vary depending on the technique used in forming the same. Typically, the screen oxide 30 has a thickness from about 2 to about 10 nm. After formation of the screen oxide 30, a dummy emitter layer is formed by a deposition process such as chemical vapor deposition, plasma chemical vapor deposition, evaporation or other like technique. The dummy emitter layer can be composed of any material such as doped or undoped polysilicon. The dummy emitter layer formed at this point of the present invention typically has a thickness from about 50 to about 200 nm.

After deposition of the dummy emitter layer, the dummy emitter layer is patterned by lithography and etching so as to form a dummy emitter 32 on a portion of the screen oxide 30 that lays above the thin BOX 22 and the conductive back electrode 24.

In an optional embodiment (not shown), a low temperature oxide (LTO) layer can be formed atop the structure including the dummy emitter 32 (including the sidewalls) using a deposition process that is performed at a temperature from about 400° to about 650° C. The thickness of the optional LTO may vary, but typically, the optional LTO has a thickness from about 1 to about 10 nm.

A nitride-containing layer 34 having a thickness from about 50 to about 200 nm can be formed atop the structure including the dummy emitter 32, with or without the optional LTO. The nitride-containing layer 34 can be comprised of any nitrogen-containing dielectric including, for example, $Si_3N_4$ or SiON. The nitride-containing layer is formed by a conventional deposition process such as, for example, chemical vapor deposition.

Figure 9A:
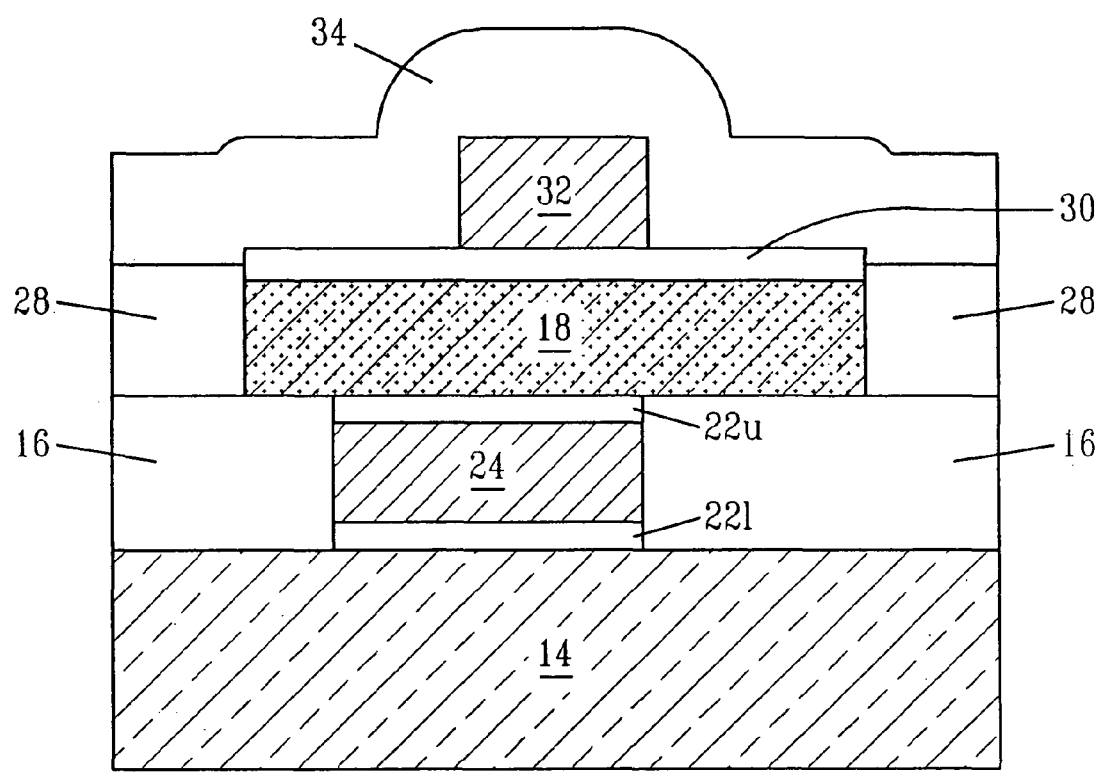
FIGS. 9A-9H depict the process flow of the present invention for fabricating the bipolar device after thin BOX formation.

The structure including the trench isolation regions 28, screen oxide 30, dummy emitter 32 and nitride-containing layer 34 is shown, for example, in FIG. 9A.

The nitride-containing layer 34 is then subjected to an anisotropic etching process to form nitride spacers 36 on the sidewalls of the dummy emitter 32. Each nitride spacer 36 has a length, shown as Lsp1 or Lsp2, as measured from the bottom surface of the spacer, from about 30 to about 150 nm. The length of the spacers 36 should be sufficiently wide to include the tolerance for lateral diffusion of dopants from the extrinsic base and the extrinsic collector and undercut of the screening oxide 30 when opening the emitter.

A photoresist is then deposited and patterned by lithography so as to provide a patterned mask 38 over a preselected portion of the structure, while leaving another portion of the structure exposed. In particular, portions of the SOI layer 18 in which either the extrinsic collector or intrinsic base is to be formed can be protected by the patterned mask 38, while exposing other portions of the SOI layer in which either the extrinsic collector or the extrinsic base is to be formed.

Figure 9B:
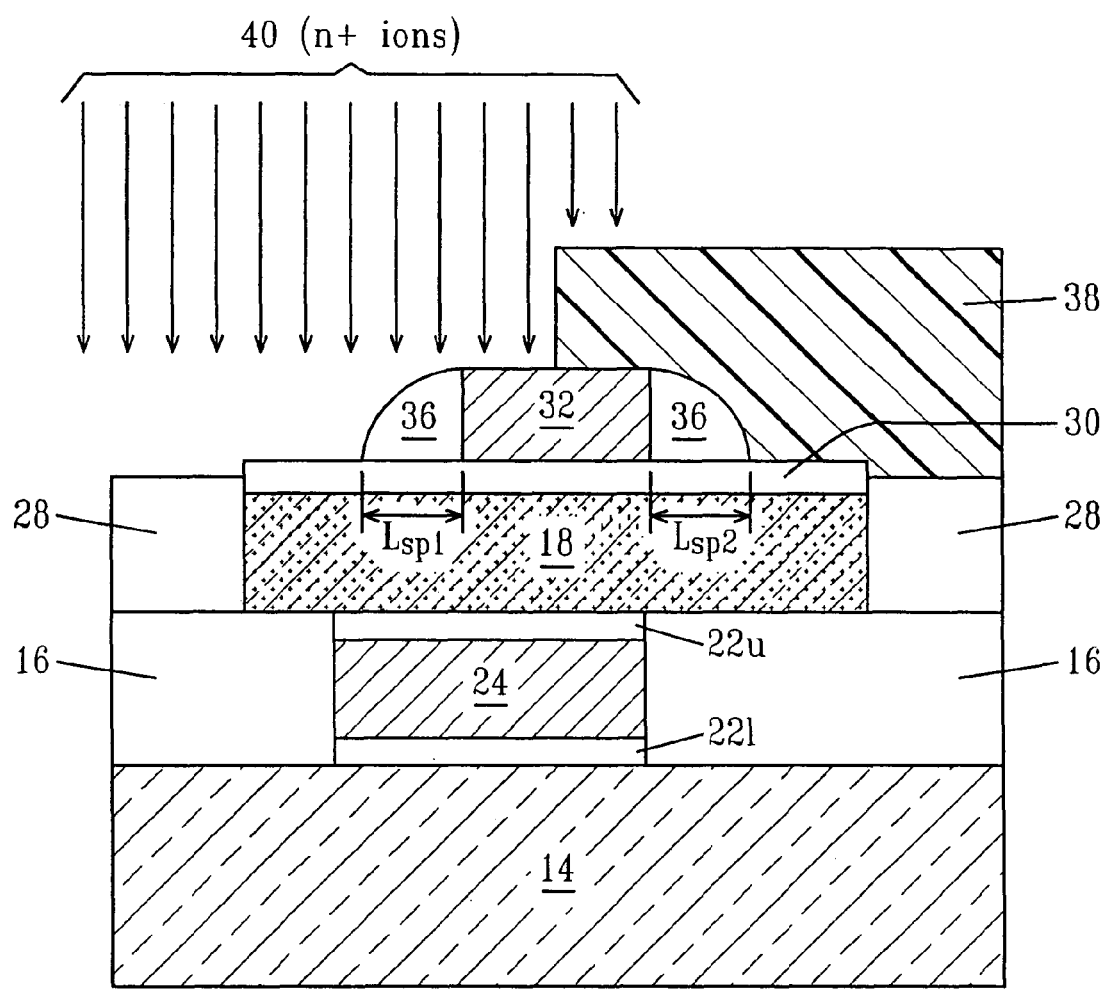

In FIG. 9B, the patterned mask 38 is located atop the portion of the SOI layer in which the extrinsic collector is to be subsequently formed. Depending on the area protected, a p or n-type dopant can be implanted into the structure. In the embodiment illustrated, the patterned mask 38 is located atop the region in which the extrinsic base will subsequently be formed and an n+ dopant such as P or As is implanted into the exposed SOI layer 18 forming extrinsic collector 41, see FIGS. 9B and 9C. Reference numeral 40 denotes the ions being implanted into the structure, see FIG. 9B. The dopant concentration for the n-type implant is typically from about 1E19 to about 2E20 atoms/cm$^3$.

Figure 9C:
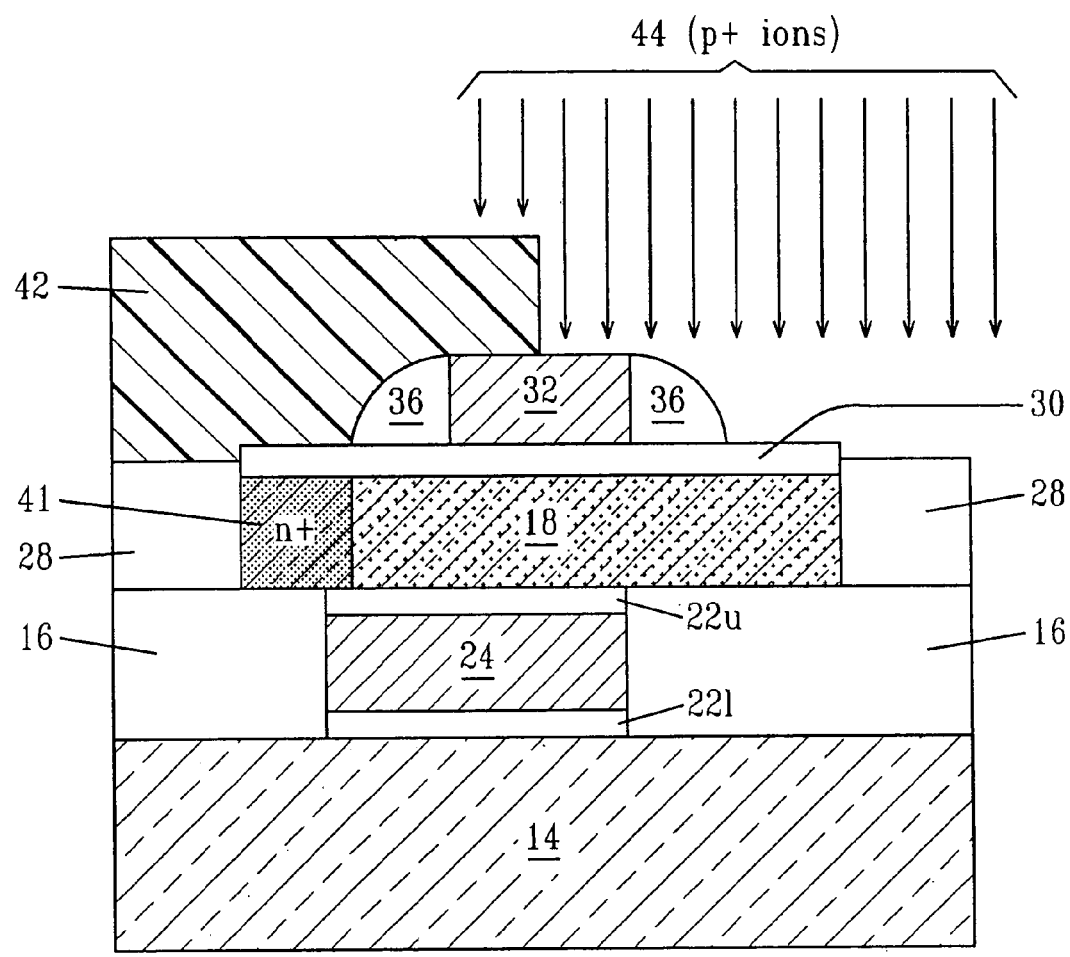

Next, the patterned mask 38 is removed and another patterned mask 42 is formed by lithography and etching over the previously implanted area. The exposed SOI layer 18, not containing the previous implant, is then implanted with the opposite conductivity type dopant. For example, a p+ dopant such as boron, $BF_2$ or Sb is then implanted into the exposed SOI layer 18 forming extrinsic base 45, see FIG. 9D. In FIG. 9C, reference numeral 44 denotes the p type dopants being implanted into the structure. The patterned mask 42 is removed after the implant step. The dopant concentration for the p-type implant is typically from about 1E19 to about 1E20 atoms/cm$^3$.

It is emphasized that although the extrinsic collector 41 is shown as being formed prior to the formation of the extrinsic base 45, the present invention also contemplates the reverse order of fabrication.

Figure 9D:
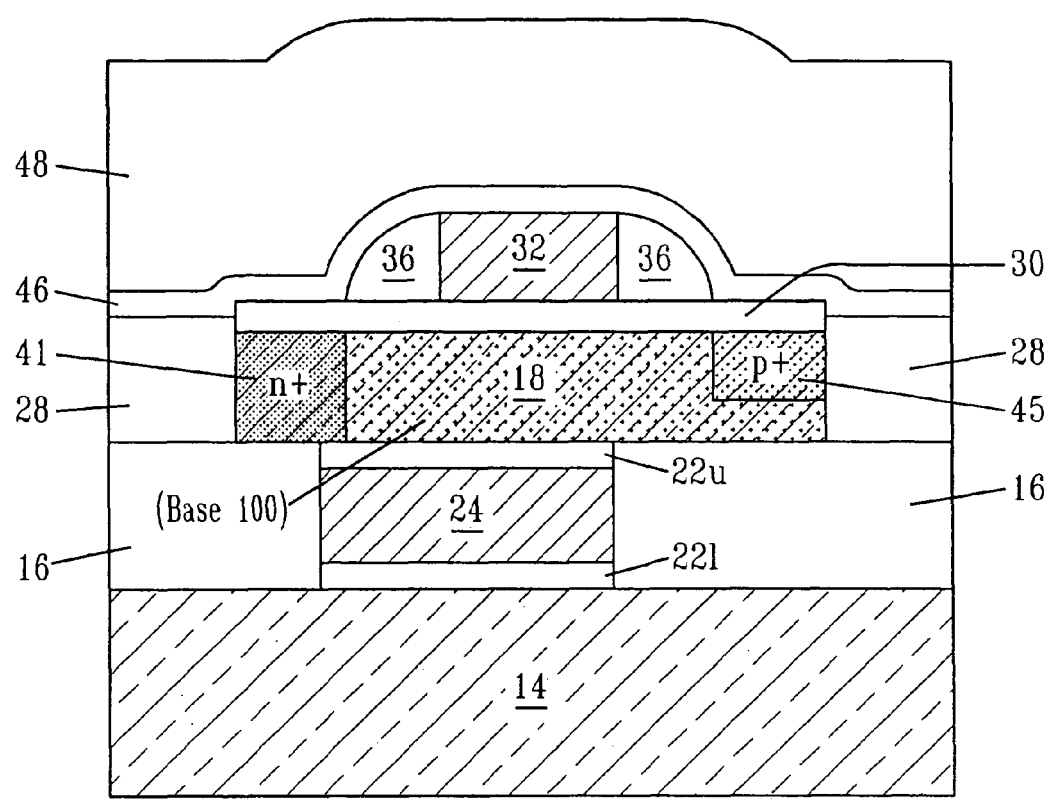

The depth of the dopants being implanted in each of the steps mentioned above is such that after activation thereof the implant region can extend to the surface of the thin BOX layer 22u, or the implants do not need to extend down to the thin BOX 22u. In FIG. 9D, the extrinsic collector 41 is shown to be in contact with the underlying thin BOX 22u, while the intrinsic base 45 is not. The extrinsic base 45 and the extrinsic collector 41 are separated by the base 100. Typically, the base 100 and the extrinsic base 45 contain the same dopant conductivity, but with different concentrations, while the extrinsic collector 41 has an opposite dopant conductivity to either the base 100 or the extrinsic base 45.

Next, and as also shown in FIG. 9D, an etch stop layer 46 composed of a dielectric other than an oxide such as, for example, a nitride is formed atop the structure shown in FIG. 9C. The etch stop layer 46 is a relatively thick layer having a thickness on the order of greater than 50 nm. The etch stop layer 46 is formed by a conventional deposition process well known in the art including, for example, a room temperature chemical vapor deposition, plasma-assisted chemical vapor deposition, chemical solution deposition and evaporation.

Next, a planarizing material 48 such as boron phosphorous doped silicate glass (BPSG), TEOS or another like dielectric is then deposited by a conventional deposition process atop the structure including the etch stop layer 46, which as indicated above, has a thickness of greater than 50 nm. The resultant structure is shown, for example, in FIG. 9D. The planarizing material 48 has a deposited thickness that is typically from about 500 to about 1000 nm.

Figure 9E:
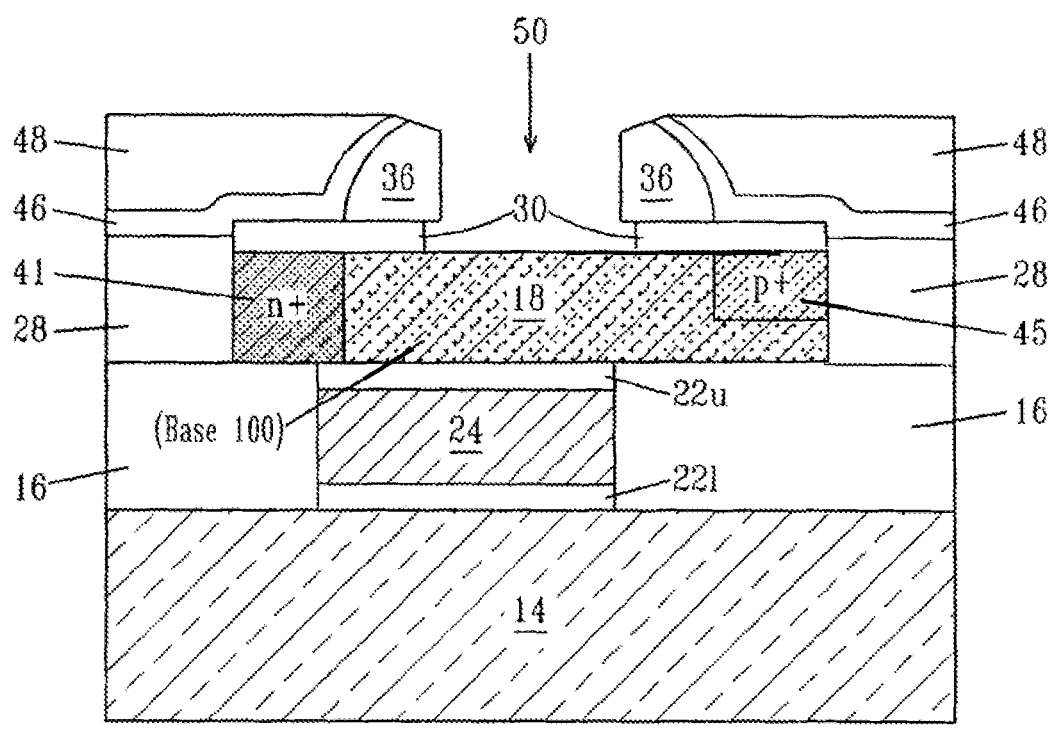

After forming the planarizing material 48, the structure, in particular the planarizing material, is planarized by a planarization process such as chemical mechanical polishing, grinding, etching or any combination thereof. The planarization stops atop the surface of the etch stop layer 46 that is located above the dummy emitter 32. The etch stop layer 46 atop the dummy emitter 32 is then removed utilizing an etching process that is selective for removing the etch stop layer 46. This etching step exposes the upper surface layer of the dummy emitter 32, which is thereafter removed utilizing an etching step that selectively removes the dummy emitter material from the structure. The removal of the dummy emitter 32 exposes the upper surface of the screen oxide 30. The exposed portion of the screen oxide 30 is then removed utilizing an etching process that selectively removes oxide. Illustrative examples of etching process that selectively remove oxide include a dry HF etch or a chemical oxide removal etch wherein a plasma of HF and ammonia is employed. As shown in FIG. 9E, undercut regions (not labeled) can be formed beneath spacers 36.

The planarization step and the various etching steps mentioned in the previous paragraph provide a structure such as shown in FIG. 9E which includes emitter opening 50 that exposes a surface portion of base 100.

A polysilicon layer or other like semiconductor material, which will be subsequently formed into emitter 52, is deposited into the emitter opening 50 using a deposition process and then ion implantation or by utilizing an in-situ deposition process. The polysilicon layer or other like semiconductor material contains a dopant type that is opposite of that of the base. For example, if the base 100 contains a p-type doped, then the polysilicon layer or the like semiconductor layer formed at this point of the present invention will contain an n-type dopant. The thickness of the deposited polysilicon or other like semiconductor layer may vary depending on the deposition process used in forming the same. Typically, however, the polysilicon or other like semiconductor layer has a thickness that is from about 60 to about 250 nm.

A hardmask which has a thickness that is typically greater than the previously formed etch stop layer 46 is then deposited on the polysilicon (or other like semiconductor material) via a conventional deposition process. The thickness of the hardmask is generally greater than about 50 nm. The hardmask is typically composed of the same dielectric material as the etch stop layer 46. Alternatively, the hardmask is composed of a dielectric material that is different from the etch stop layer 46.

Figure 9F:
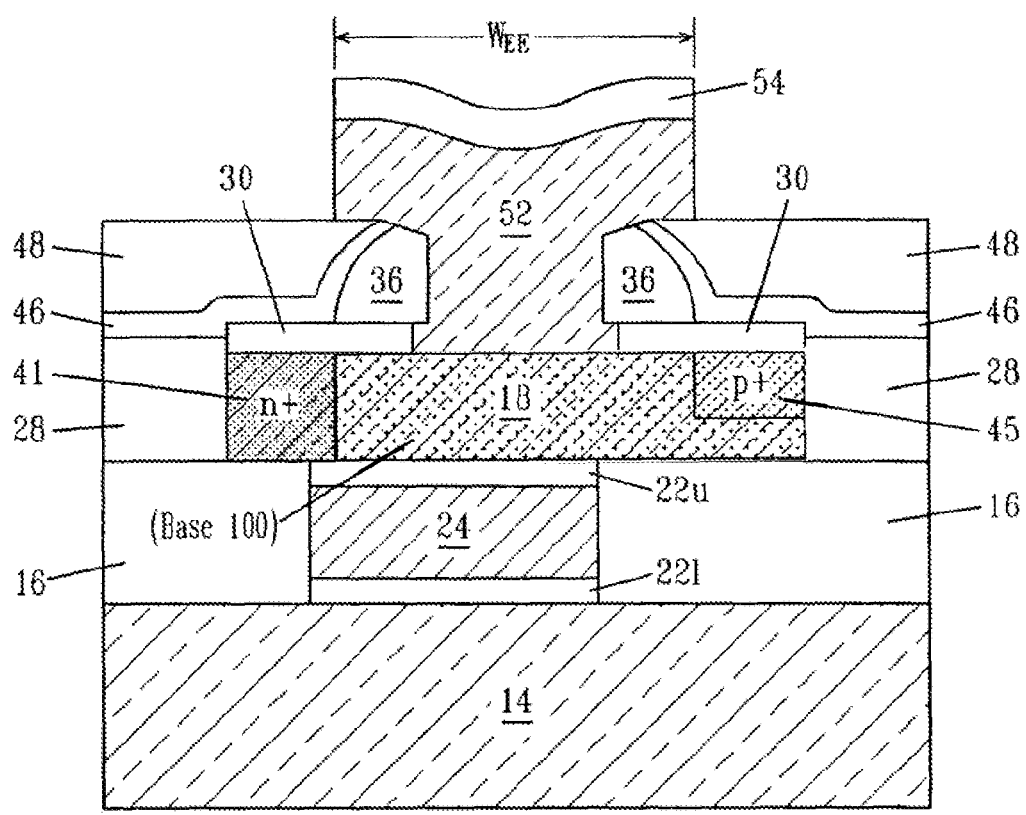

The hardmask and the polysilicon layer (or other like semiconductor layer) are then patterned by lithography and etching so as to provide a structure such as shown, for example, in FIG. 9F. In the illustrated structure, a patterned hard mask 54 and an emitter 52 are formed. The emitter 52 may have the T-shaped pattern shown in the drawings or, it may have a different pattern such as a block-shaped emitter. The width Wee of the emitter 52, as measured at the top surface, is generally from about 100 to about 500 nm.

The structure shown in FIG. 9F is then subjected to an etch back process wherein exposed portions of the planarizing material 48, underlying etch stop layer 46, and screen oxide 30 are each removed. The various layers mentioned in the previous sentence can be removed in one etching step or preferably multiple etching steps are employed. The etch chemistries used in removing the planarizing material 48, etch stop layer 46 and screen oxide 30 are selective in removing the various layers from the structure. Note that the hardmask 54 is typically removed during the etch back process. Alternatively, the hardmask 54 can be removed after the etch back process.

Figure 9G:
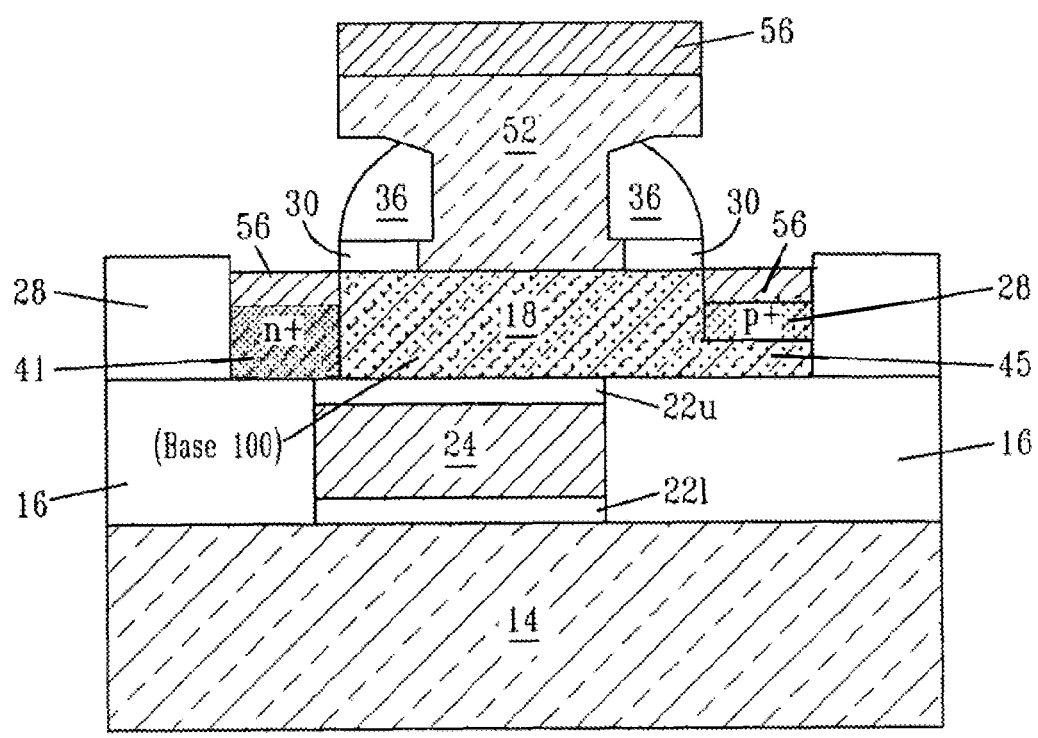

After the etch back step, which exposes the extrinsic collector 41, the extrinsic base 45, trench isolation oxide 28, and typically the emitter 52 and the conductive back electrode 24, the exposed surface containing Si, i.e., extrinsic collector 41, extrinsic base 45, conductive back electrode 24 and emitter 52, are then subjected to a conventional silicidation process in which a silicide metal such as Ti, Ni, Co, W, Re or Pt is first deposited and then annealed to cause interaction of the metal and Si and subsequent formation of silicide 56 on each region including metal and Si. Alloys of the above mentioned metals are also contemplated herein. Any remaining metal, not silicided, is typically removed after the silicide process using a conventional wet etching process. The resultant structure after etch back and silicidation is shown in FIG. 9G. It is noted that the silicides formed in the extrinsic collector 41 and the extrinsic base 45 are self-aligned to the base 100. Also, the silicide atop of the emitter 52 is self-aligned to the emitter 52.

At this point of the present invention, an optional barrier material such as a nitride can be formed atop the structure shown in FIG. 9G. The optional barrier material is not shown in the drawings of the present invention.

An interconnect dielectric 58 such as, for example, boron phosphorus doped silicate glass, an oxide, an organic polymer or an inorganic polymer is then deposited using a conventional deposited process such as chemical vapor deposition, plasma-assisted chemical vapor deposition, evaporation, spin-on coating, chemical solution deposition and the like. The interconnect dielectric 58 has a thickness after deposition that is on the order of about 500 to about 1000 nm. After deposition of the interconnect dielectric 58, the interconnect dielectric 58 is planarized by chemical mechanical polishing or other like planarization process so as to have a thickness after planarization from about 300 to about 600 nm and thereafter a contact opening that extends to the surface of each silicide 56 is formed by lithography and etching. Each of the contact openings is then filled with a metal contact 60 such as W, Cu, Al, Pt, Au, Rh, Ru and alloys thereof. The resultant structure is shown, for example, in FIG. 9H.

Figure 9H:
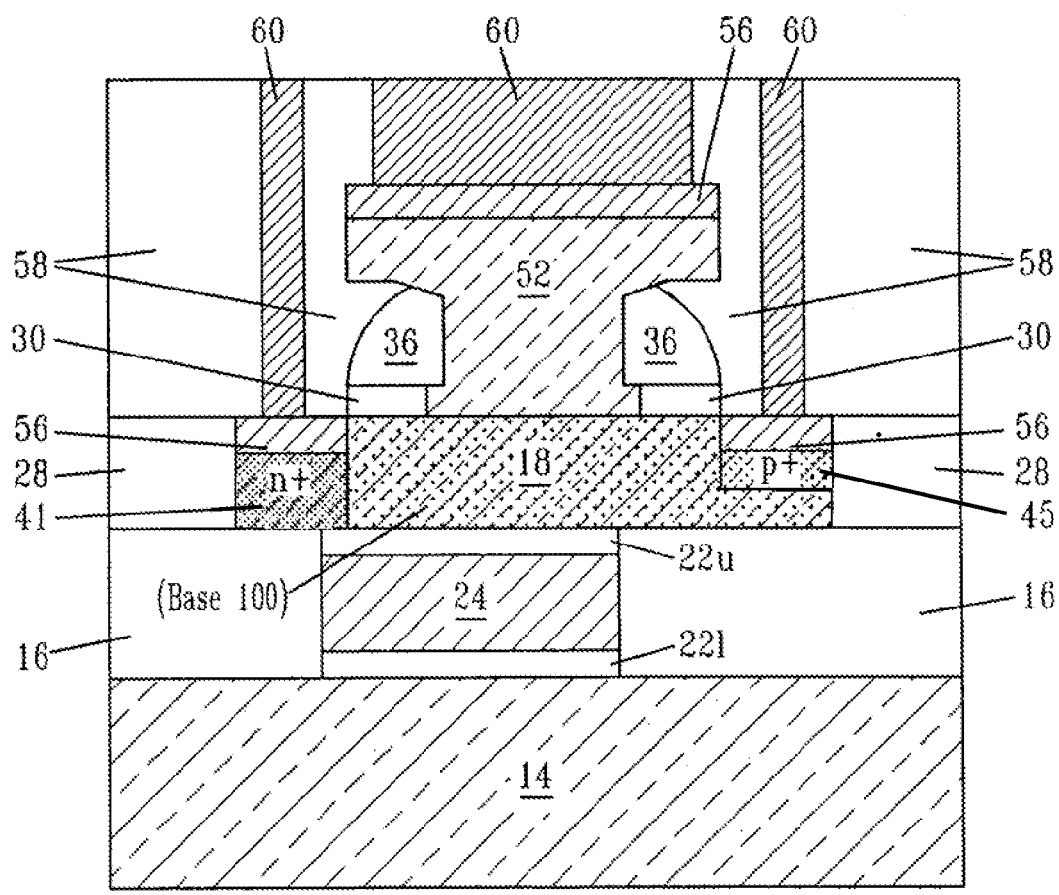

The structure shown in FIG. 9H can now be biased by applying an external voltage to the conductive back electrode 24 through the contacts produced above. The biasing causes an inversion charge layer 62 to be formed in a portion of the base 100 that is located above the thin BOX 22u. The amount of voltage applied in forming the inversion charge layer 62 is typically 5 V or less. The inversion charge layer 62 serves as the collector of the inventive structure.

Figure 10:
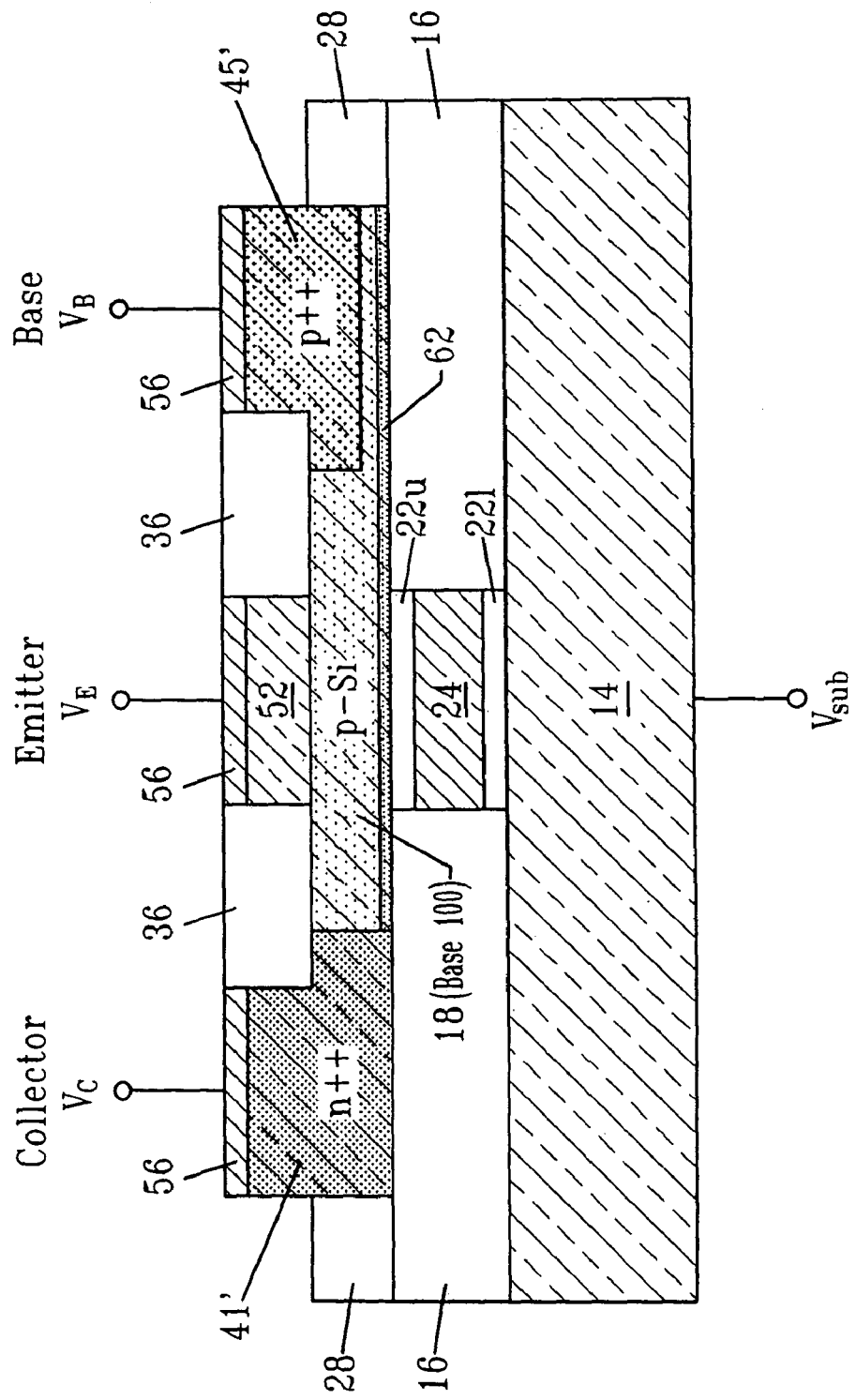
FIG. 10 is a cross-sectional view of a 'collector-less' vertical bipolar transistor of the present invention including a raised extrinsic collector and a raised extrinsic base.

In another embodiment of the present invention and in order to achieve high performance, the SOI layer 18 has to be thin (less than 50 nm) and the series resistance of the extrinsic collector 41 and extrinsic base 45 can be quite high even if they are heavily doped. Therefore, selective silicon or SiGe epitaxy can be used to form raised extrinsic collector 41' and raised extrinsic base 45' in order to reduce the series resistance, as shown in FIG. 10.

The methods described above can be used to form a plurality of vertical bipolar transistors on the active area of the SOI substrate shown in FIG. 8E. The methods described above can also be used in conjunction with a conventional CMOS process flow which is capable of forming CMOS devices such as field effect transistors, in areas adjacent to the areas containing the vertical bipolar transistors of the present invention, to form BiCMOS for RF or mixed-signal applications. In the prior art, the CMOS devices are typically formed prior to the bipolar devices with CMOS areas usually protected during fabrication of the bipolar transistors. The drawback of this method is that the MOS device performance often becomes degraded to the excessive thermal budget that CMOS devices experience during the fabrication of the dipolar devices, such as dopant activation anneal after implants. An advantage of this invention over prior art processes is that the inventive method utilizes the typical CMOS process to form a bipolar device hence the CMOS and bipolar devices can be fabricated interactively and share the same activation anneal. Only one additional blocking mask is needed to fabricate the bipolar devices together with the CMOS in order to form the BiCMOS.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claim.

What is claimed is:

1. A method of fabricating a bipolar transistor comprising the steps of:
   providing a silicon-on-insulator (SOI) substrate comprising a first semiconductor layer located over a first insulating layer, wherein a portion of the first insulating layer beneath said first semiconductor layer is removed providing an undercut region;
   forming a second insulating layer on exposed surfaces of said first semiconductor layer, wherein said second insulating layer is thinner than said first insulating layer;
   filling the undercut region and the removed portion of the first semiconductor layer with a conductive back electrode material;
   forming an extrinsic base containing a first conductivity dopant and an extrinsic collector containing a second conductivity type dopant in portions of the first semiconductor layer;
   forming an emitter comprising a second semiconductor layer including said second conductivity type dopant over a portion of said first semiconductor layer; and
   biasing the conductive back electrode material to form an inversion charge layer at an interface between the first semiconductor layer and the second insulating layer.

2. The method of claim 1 wherein said providing the SOI substrate comprises forming a trench into the first semiconductor layer, stopping on said first insulating layer; and performing an isotropic etch process to form said undercut region.

3. The method of claim 1 wherein said forming the second insulating layer comprises a thermal growth process.

4. The method of claim 1 wherein said filling the undercut region comprises depositing a doped polysilicon layer.

5. The method of claim 1 wherein said extrinsic collector is formed by forming a patterned mask on at least a portion of the first semiconductor layer and ion implanting into exposed portions of the first semiconductor layer, and said extrinsic base is formed by forming a patterned mask on at least a portion of the first semiconductor layer and ion implanting into exposed portions of the first semiconductor layer.

6. The method of claim 1 wherein the extrinsic base contains a p-type dopant and the extrinsic collector contains an n-type dopant, wherein the dopants are introduced via separate ion implantation processes.

7. The method of claim 1 wherein the forming the emitter includes the step of forming a dummy emitter on the first semiconductor layer, forming spacers about the dummy emitter, forming an etch stop layer and a planarizing material, planarizing the planarizing material to expose a surface of the etch stop layer atop the dummy emitter, removing the exposed etch stop layer, removing at least the dummy emitter providing an emitter opening that exposes the first semiconductor and depositing said second semiconductor layer to fill said emitter opening.

8. The method of claim 7 further comprising forming a hardmask on the second semiconductor layer and patterning the hardmask and the second semiconductor layer.

9. The method of claim 8 further comprising etching back at least said planarizing material, said hardmask and said etch stop layer exposing said emitter and surfaces of said first semiconductor layer wherein said extrinsic collector and extrinsic base are located.

10. The method of claim 9 further comprising forming a silicide on at least said emitter, said extrinsic collector and said extrinsic base utilizing a silicidation process.

11. The method of claim 10 further comprising forming an interconnect dielectric having a contact opening that exposes said silicide; and filling said contact opening with a contact metal.

12. The method of claim 1 wherein said biasing is performed using an external source.

13. The method of claim 1 further comprising forming spacers about said emitter, said spacers being formed prior to emitter formation using a dummy emitter process.

14. The method of claim 1 further comprising forming trench isolation regions on top of portions of said first insulating layer.

15. The method of claim 1 wherein said extrinsic base is not in contact with said second insulating layer.

16. The method of claim 1 further comprising forming raised extrinsic collector and extrinsic base regions.

17. The method of claim 1 wherein the undercut region is provided by an isotropic etching process in which no pad layers are present on said first semiconductor layer.

* * * * *